United States Patent
Doraiswamy et al.

(10) Patent No.: US 12,151,516 B2
(45) Date of Patent: Nov. 26, 2024

(54) SYSTEM AND METHOD FOR FEATURE EXTRACTION FROM REAL-TIME VEHICLE KINETICS DATA FOR REMOTE TIRE WEAR MODELING

(71) Applicant: Bridgestone Americas Tire Operations, LLC, Nashville, TN (US)

(72) Inventors: Srikrishna Doraiswamy, Akron, OH (US); Terence E. Wei, Copley, OH (US); Jason R. Barr, Akron, OH (US); Adrian C. Stalnaker, Cuyahoga Falls, OH (US); Thomas A. Sams, Akron, OH (US)

(73) Assignee: Bridgestone Americas Tire Operations, LLC, Nashville, TN (US)

( * ) Notice: Subject to any disclaimer, the term of this patent is extended or adjusted under 35 U.S.C. 154(b) by 506 days.

(21) Appl. No.: 17/486,504

(22) Filed: Sep. 27, 2021

(65) Prior Publication Data
US 2022/0016939 A1 Jan. 20, 2022

Related U.S. Application Data

(63) Continuation of application No. PCT/US2020/025658, filed on Mar. 20, 2020.
(Continued)

(51) Int. Cl.
*B60C 11/24* (2006.01)
*B60C 23/04* (2006.01)
(Continued)

(52) U.S. Cl.
CPC ........ *B60C 11/246* (2013.01); *B60C 23/0479* (2013.01); *G06F 17/142* (2013.01);
(Continued)

(58) Field of Classification Search
CPC . B60C 11/246; B60C 23/0479; G06F 17/142; G06N 3/045; G06N 3/084;
(Continued)

(56) References Cited

U.S. PATENT DOCUMENTS 5,557,552 A 9/1996 Naito
6,278,361 B1 8/2001 Magiawala et al.
(Continued)

FOREIGN PATENT DOCUMENTS

CN 103674573 B 5/2015
CN 108712972 A 10/2018
(Continued)

OTHER PUBLICATIONS

Salminen, Henry "Parametrizing tyre wear using a brush tyre model," Royal Institute of Technology, Stockholm, Sweden, Dec. 15, 2014, 64 pages.
(Continued)

*Primary Examiner* — Tung S Lau
(74) *Attorney, Agent, or Firm* — Shaun J. Fox; Gary L. Montle

(57) ABSTRACT

A system and method are provided for efficiently estimating vehicle tire wear. Vehicle kinetics (first) data are provided via one or more sensors associated with the vehicle and/or at least one associated tire. The vehicle kinetics data are locally processed to compress or otherwise generate second data as a reduced subset thereof, said second data representative of the first data and comprising any one or more predetermined wear-specific features extracted therefrom. The second data are selectively transmitted via a communications network to a remote computing system, which processes the second data to estimate a wear characteristic for the at least one tire. Alternatively, the second data processed to generate third data as a reconstruction of the
(Continued)

first data, and the third data and the any one or more extracted features are processed to estimate a wear characteristic for the at least one tire.

18 Claims, 19 Drawing Sheets

Related U.S. Application Data

(60) Provisional application No. 62/911,496, filed on Oct. 7, 2019, provisional application No. 62/889,684, filed on Aug. 21, 2019, provisional application No. 62/883,252, filed on Aug. 6, 2019, provisional application No. 62/843,863, filed on May 6, 2019, provisional application No. 62/827,339, filed on Apr. 1, 2019.

(51) Int. Cl.
 *G06F 17/14* (2006.01)
 *G06N 3/045* (2023.01)
 *G07C 5/00* (2006.01)
 *G07C 5/08* (2006.01)
 *H04L 12/40* (2006.01)

(52) U.S. Cl.
 CPC ............. *G06N 3/045* (2023.01); *G07C 5/006* (2013.01); *G07C 5/008* (2013.01); *G07C 5/0808* (2013.01); *H04L 12/40* (2013.01); *H04L 2012/40215* (2013.01); *H04L 2012/40273* (2013.01)

(58) Field of Classification Search
 CPC ...... G07C 5/006; G07C 5/008; G07C 5/0808; G07C 5/0841; H04L 12/40; H04L 2012/40215; H04L 2012/40273; H04L 12/40013
 See application file for complete search history.

(56) References Cited

U.S. PATENT DOCUMENTS

| | | | |
|---|---|---|---|
| 6,327,904 B1 | 12/2001 | Oldenettel | |
| 6,338,270 B1 | 1/2002 | Mancosu et al. | |
| 6,691,566 B2 | 2/2004 | Iwasaki et al. | |
| 6,759,952 B2 | 7/2004 | Dunbridge et al. | |
| 6,761,060 B2 | 7/2004 | Mancosu et al. | |
| 7,391,306 B2 | 6/2008 | Dufournier | |
| 7,443,288 B2 | 10/2008 | Dunbridge et al. | |
| 7,483,794 B1 | 1/2009 | Bocquillon et al. | |
| 8,061,191 B2 | 11/2011 | Hanatsuka | |
| 8,207,839 B2 | 6/2012 | Fujita et al. | |
| 8,483,976 B2 | 7/2013 | Morinaga | |
| 8,600,917 B1 | 12/2013 | Schimert et al. | |
| 8,965,691 B1 | 2/2015 | Lombrozo | |
| 9,016,116 B1 | 4/2015 | Hammerschmidt | |
| 9,050,864 B2 | 6/2015 | Singh et al. | |
| 9,259,976 B2 | 2/2016 | Singh et al. | |
| 9,285,293 B2 | 3/2016 | Seta et al. | |
| 9,315,178 B1 | 4/2016 | Ferguson et al. | |
| 9,610,810 B1 | 4/2017 | Singh | |
| 9,663,115 B2 | 5/2017 | Singh | |
| 9,688,194 B2 | 6/2017 | Macneille et al. | |
| 9,773,251 B2 | 9/2017 | Liu et al. | |
| 9,873,293 B2 | 1/2018 | Singh et al. | |
| 9,963,132 B2 | 5/2018 | Singh | |
| 10,196,504 B2 | 2/2019 | Sandstrom | |
| 2010/0060443 A1 | 3/2010 | Wakao et al. | |
| 2010/0199756 A1 | 8/2010 | Hanatsuka | |
| 2011/0118989 A1 | 5/2011 | Morinaga | |
| 2012/0020526 A1 | 1/2012 | Teti | |
| 2012/0020626 A1 | 1/2012 | Tanazawa | |
| 2014/0366184 A1 | 12/2014 | Rehman | |
| 2014/0366618 A1 | 12/2014 | Singh | |
| 2015/0005982 A1 | 1/2015 | Muthukumar | |
| 2015/0057877 A1 | 2/2015 | Singh | |
| 2015/0090023 A1 | 4/2015 | Masago | |
| 2016/0229232 A1 | 8/2016 | Baumgaertel et al. | |
| 2016/0343126 A1 | 11/2016 | Miller et al. | |
| 2017/0023441 A1 | 1/2017 | Luk et al. | |
| 2017/0113494 A1* | 4/2017 | Singh | B60C 23/0486 |
| 2017/0113495 A1 | 4/2017 | Singh | |
| 2017/0124784 A1* | 5/2017 | Wittmann | G06V 30/224 |
| 2017/0166215 A1 | 6/2017 | Rander | |
| 2017/0182985 A1 | 6/2017 | Dai | |
| 2017/0193714 A1 | 7/2017 | Gonzales, Jr. | |
| 2017/0246915 A1 | 8/2017 | Besnoin et al. | |
| 2017/0278314 A1 | 9/2017 | Laskey et al. | |
| 2018/0154707 A1 | 6/2018 | Singh | |
| 2018/0272813 A1 | 9/2018 | Singh | |
| 2019/0001757 A1 | 1/2019 | Singh | |
| 2020/0164695 A1 | 5/2020 | Kilaru | |

FOREIGN PATENT DOCUMENTS

| | | | |
|---|---|---|---|
| EP | 3378679 A1 | 9/2018 | |
| JP | 2006327368 A | 12/2006 | |
| JP | 2015101122 A | 6/2015 | |
| JP | 2018158722 A | 10/2018 | |
| JP | 2019011048 A | 1/2019 | |
| WO | 2018138011 A1 | 8/2018 | |

OTHER PUBLICATIONS

International Searching Authority: Korean Intellectual Property Office Search Report for corresponding International Patent Application No. PCT/US2020/025658 dated Jul. 24, 2020, 11 pages.
Seigel, Joshua, et al. "A Smartphone-Operable Densely Connected Convolutional Neural Network for Tire Condition Assessment," Department of Mechanical Engineering, Massachusetts Institute of Technology, Cambridge, MA 02139j_siegel@mit.edu, 12 pages.
Ngeno, Ray, et al.: "Analysis of tyre wear using the expanded brush tyre model," KTH Royal Institute of Technology, Stockholm, Sweden, Bachelor degree in Vehicle Engineering SA105X.
The Japan Patent Office, Office Action, Nov. 24, 2022, 4-5 Pages.
The China National Intellectual Property Administration, Office Action, Dec. 1, 2022, 9 pages.
International Search Authority: Supplementary European Search Report for corresponding Application No. EP 20 78 2646 dated Nov. 4, 2022.

* cited by examiner

SYSTEM AND METHOD FOR FEATURE EXTRACTION FROM REAL-TIME VEHICLE KINETICS DATA FOR REMOTE TIRE WEAR MODELING

CROSS-REFERENCES TO RELATED APPLICATIONS

This application is a continuation of International Application Number PCT/US2020/026658, filed Mar. 20, 2020, and further claims benefit of U.S. Provisional Patent Application Nos. 62/827,339, filed Apr. 1, 2019, 62/843,863, filed May 6, 2019, 62/883,252, filed Aug. 6, 2019, 62/889,684, filed Aug. 21, 2019, and 62/911,496, filed Oct. 7, 2019, each of which is hereby incorporated by reference in its entirety.

FIELD OF THE INVENTION

The present invention relates generally to the modeling and predicting of tire performance and the provision of feedback based thereon. More particularly, an embodiment of an invention as disclosed herein relates to system and method for summarizing high frequency vehicle data in order to transmit extracted relevant features for remotely estimating vehicle tire wear.

BACKGROUND

Prediction of tire wear and corresponding tire traction capabilities is an important tool for anyone owning or operating vehicles, particularly in the context of vehicle fleet management. As tires are used, it is normal for the tread to gradually become shallower and overall tire performance to change. At a certain point it becomes critical to be aware of the tire conditions, as insufficient tire tread can create unsafe driving conditions. For example, when road conditions are non-optimal the tires may be unable to grip the road and a driver may lose control of his or her vehicle. Generally stated, the shallower the tire tread, the more easily the driver may lose traction, particularly when driving at improper speeds or in adverse weather conditions such as rain, snow, or the like.

In addition, irregular tread wear may occur for a variety of reasons that may lead users to replace a tire sooner than would otherwise have been necessary. Vehicles, drivers, and individual tires are all different from each other, and can cause tires to wear at very different rates. For instance, high performance tires for sports cars wear more quickly than touring tires for a family sedan. However, a wide variety of factors can cause a tire to wear out sooner than expected, and/or cause it to wear irregularly and create noise or vibration. Two common causes of premature and/or irregular tire wear are improper inflation pressure and out-of-spec alignment conditions.

Tire wear is known to progress in a non-linear fashion throughout the life of a tire. One primary reason for this is that as the tread wears over time, the tread blocks become stiffer. In addition, the tread patterns are typically designed to have less void area as the tire wears. Either or both of these characteristics can contribute to a slower wear rate.

The focus of most tire wear predictions is on the initial wear rate—the wear rate when the tire is brand new. This is at least in part because the tire industry is typically concerned with new tire performance in general, due to having to meet original equipment manufacturer (OEM) requirements. To predict the performance of a tire for the entirety of its life, a new wear model is required.

However, tire wear is a complex phenomenon to model. There are accurate models currently in existence that utilize finite element analysis (FEA), but these simulations can typically take weeks to complete. If it is desired to simulate the wear rate at several different tread depths, this would further take months of computationally expensive simulations.

It would be desirable to provide users with substantially real-time predictions about the performance and capabilities of their tires. Such information may lead not only to greater customer satisfaction, but to less accidents generally. A large percentage of tire-related accidents occur due to low tread depth and the corresponding lack of traction, and it would be desirable to provide the end-user with appropriate recommendations regarding the same.

It would further be desirable to estimate the traction capabilities of the tire, and provide such feedback as an input to models for other useful/actionable predictions or control loops.

It would further be desirable to estimate the tread depth of the tire, and provide such feedback as an input to models for other useful/actionable predictions such as for example traction, fuel efficiency, durability, etc. An accurate tread depth prediction is the first step to predicting numerous other tire performance areas.

It would further be desirable to provide these services as part of a distributed and relatively automated tire-as-a-service model, without requiring manual tread depth measurements such as for example would typically be provided by field engineers and/or with dedicated equipment.

It is known to produce high frequency vehicle data and/or tire data for the purpose of determining vehicle conditions at a given time. However, continuous collection of streaming data results in an overwhelming volume of data points, which is typically impractical from each of a data transmission, storage, and processing perspective. It would further be desirable to improve the state of knowledge based on measurements of tread depth, providing real time feedback to users (e.g., individual drivers, fleet managers, other equivalent end-users) based on an improved ability to predict the wear life left in a tire based on a few periodic measurements, and thereby enabling the user to achieve maximum value out of the tire.

BRIEF SUMMARY

In a first exemplary embodiment as disclosed herein, the aforementioned objects may be attained via a computer-implemented method for modeling and predicting of tire performance and the provision of feedback based thereon. The method includes collecting vehicle data for a vehicle and/or tire data for at least one tire associated with the vehicle, and determining a current tire wear status in real-time for the at least one tire, based at least in part on the collected data. One or more tire performance characteristics are predicted, based at least in part on the determined tire wear status and the collected data. Real-time feedback is selectively provided, based on the predicted one or more tire performance characteristics and/or determined current tire wear status.

Additional advantageous features are further realized in an exemplary variant on the above-referenced first embodiment, wherein a second embodiment of the computer-implemented method is disclosed herein for estimating a tire wear status, and comprises accumulating in data storage information regarding probability distributions corresponding to each of a respective plurality of tire wear factors.

Vehicle data and/or tire data comprising movement data and location data collected in association with a vehicle is transmitted from the vehicle to a remote server. At least one observation corresponding to one or more of the plurality of factors is generated based on the transmitted vehicle data. A Bayesian estimation of a tire wear status at a given time is generated for at least one tire associated with the vehicle, based at least on the at least one generated observation and the stored information regarding probability distributions.

One exemplary aspect of the aforementioned second embodiment may include storing information regarding updated probability distributions corresponding to a respective plurality of factors contributing to tire wear for the at least one tire associated with the vehicle, based at least on the generated at least one observation.

Another exemplary aspect of the aforementioned second embodiment may include predicting a tire wear status at one or more future parameters for the at least one tire associated with the vehicle. For example, the tire wear status may be predicted with respect to an upcoming period of time that the vehicle is driven, or with respect to an upcoming distance to be traveled.

Another exemplary aspect of the aforementioned second embodiment may include predicting a replacement time for the at least one tire associated with the vehicle, based on a current tire wear status or the predicted tire wear status as compared with tire wear thresholds associated with the at least one tire associated with the vehicle.

In another exemplary aspect of the aforementioned second embodiment, the information regarding the plurality of probability distributions may reflect an array of time-series characterization curves.

Another exemplary aspect of the aforementioned second embodiment may include receiving one or more tire wear input values from a user via a user interface associated with the remote server and generating at least one observation for one or more of the plurality of factors based on the one or more tire wear input values.

Another exemplary aspect of the aforementioned second embodiment may include receiving one or more tire wear input values generated by one or more sensors mounted in or on a respective tire of the at least one tire and generating at least one observation for one or more of the plurality of factors based on the one or more tire wear input values.

Another exemplary aspect of the aforementioned second embodiment may include receiving one or more tire wear input values generated by a sensor external to the vehicle and generating at least one observation for one or more of the plurality of factors based on the one or more tire wear input values.

In another exemplary aspect of the aforementioned second embodiment, at least one of the tire wear input values generated by the sensor external to the vehicle comprises a tread depth measurement.

Another exemplary aspect of the aforementioned second embodiment may include generating an estimated tire wear status with a baseline value and a range corresponding to a confidence level for the estimation.

A system may be provided in accordance with the above-referenced second embodiment to estimate a tire wear status. The system may include a data storage network having stored thereon information regarding probability distributions corresponding to each of a respective plurality of tire wear factors. For each of a plurality of vehicles, distributed computing nodes are linked to one or more vehicle-mounted sensors respectively configured to collect vehicle data. A server-based computing network is provided comprising computer readable media having instructions residing thereon and executable by one or more processors to direct the performance of aspects previously recited with respect to the second embodiment.

Additional advantageous features are further realized in another exemplary variant on the above-referenced first embodiment, wherein a third embodiment of the computer-implemented method is disclosed herein for an analytical tire wear model utilizing a brush-type model. The brush-type model is a simplified tire model that models the tread elements as independent "brush bristles" which greatly reduces the complexity of modeling the contact interface between the road and rubber. This model can capture the first order effects (tread block stiffening and contact area increasing) that occurs in a real tire as it wears.

In accordance with the third exemplary embodiment, an original tread depth is determined for a tire associated with a vehicle, and an initial wear rate is determined for the tire based at least partially on the original tread depth. One or more tire conditions are measured as time-series inputs to a predictive tire wear model. A current wear rate is normalized based on said inputs with respect to the initial wear rate for the tire, wherein a tire wear status of the tire can be predicted for one or more specified future parameters.

In one aspect of the aforementioned third embodiment, the current wear rate is further determined at least in part based on a brush-type tire wear model for a contact interface between a base material of the tire and a road surface, wherein the interface is represented as a plurality of independently deformable elements.

In another aspect of the aforementioned third embodiment, the measured one or more tire conditions comprise detected contact areas and void areas corresponding to tire tread depths.

In another aspect of the aforementioned third embodiment, the one or more specified future parameters are associated with a time traveled.

Alternatively, the one or more specified future parameters may be associated with a distance traveled.

In another aspect of the aforementioned third embodiment, a replacement time for the tire may be predicted based on the predicted tire wear status as compared with one or more predetermined tire wear thresholds associated with the tire.

In another aspect of the aforementioned third embodiment, an alert is generated to a user associated with the vehicle based on the predicted replacement time.

In another aspect of the aforementioned third embodiment, one or more measured conditions are received from a user via a user interface.

In another aspect of the aforementioned third embodiment, one or more of the measured conditions are generated by one or more sensors mounted in or on the tire and received therefrom.

In another aspect of the aforementioned third embodiment, one or more measured conditions are generated by a sensor external to the vehicle and received therefrom. At least one of the tire wear input values generated by the sensor external to the vehicle may comprise a tread depth measurement.

In another aspect of the aforementioned third embodiment, a tire rotation threshold event and/or an alignment threshold event may be predicted by the system based at least partially on the time-series inputs and/or the predicted tire wear status. An alert may accordingly be generated to a user interface associated with the vehicle based thereon. The user interface may be a static display mounted in the vehicle, a display for a mobile computing device associated with a driver of the vehicle, etc.

In another aspect of the aforementioned third embodiment, an optimal type of tire for the vehicle may be predicted based at least in part on the time-series inputs and/or the predicted tire wear status. An alert may accordingly be generated to a user interface associated with the vehicle based thereon. The user interface may be a static display mounted in the vehicle, a display for a mobile computing device associated with a driver of the vehicle, etc.

In an embodiment, a system may be provided for predicting progression in vehicle tire wear in accordance with the aforementioned third embodiment, comprising a server functionally linked to a data storage network. The data storage network includes an original tread depth for a tire associated with a vehicle, and a predictive tire wear model. One or more sensors are provided and configured to provide signals corresponding to measured tire conditions. The server is configured to determine an initial wear rate for the tire based on the original tread depth and the tire wear model, collect the signals corresponding to the measured tire conditions as time-series inputs to the predictive tire wear model, normalize a current wear rate based on said inputs to the initial wear rate for the tire, and predict a tire wear status of the tire for one or more specified future parameters.

In one exemplary aspect of the system according to the third embodiment, the wear rate may be modeled using a brush-type tire wear model for a contact interface between a base material of the tire and a road surface, wherein the interface is represented as a plurality of independently deformable elements. Alternative physics-based tire wear models may also be implemented within the scope of the present disclosure, including but not limited to FEA models.

Additional advantageous features are further realized in an exemplary variant on the above-referenced first embodiment, wherein a fourth embodiment of the computer-implemented method is disclosed herein for estimating progression in vehicle tire wear. The method according to the fourth embodiment includes storing a tread depth at a first (e.g., initial or unworn) stage for a tire associated with a vehicle. The method further includes sensing and storing a first set of one or more modal frequencies for the tire at the first stage, responsive to an impact associated with a first modal analysis. At a subsequent second (e.g., at least partially worn) stage, a second set of a corresponding one or more modal frequencies for the tire are sensed, responsive to an impact associated with a second modal analysis. Based on a calculated frequency shift between at least one corresponding modal frequency from each of the first and second sets, a tire wear status of the tire may be estimated at the second stage.

In one exemplary aspect of the aforementioned fourth embodiment, a mass of the tire is stored at the first stage, wherein the step of estimating the tire wear status at the second stage comprises determining a change in mass of the tire between the first and second stages based on the calculated frequency shift.

In another exemplary aspect of the aforementioned fourth embodiment, an estimated loss in tire tread is determined in relation to the change in mass of the tire between the first and second stages based on the calculated frequency shift. Alternatively, an estimated loss in tire tread may be determined via a retrievable correlation between an observed frequency shift and a change in tire tread for a given tire. The correlation may for example be retrieved from data storage with respect to a given type of tire, or may be developed over time based on historical measurements of changes in tire tread and shifts between corresponding modal frequencies associated with the given type of tire.

In another exemplary aspect of the aforementioned fourth embodiment, the first and second sets of corresponding modal frequencies are sensed via one or more accelerometers mounted in association with the tire, responsive to excitation of structural modes for the tire. The one or more accelerometers may be attached to the tire, for example at an inner lining of the tire, or may be mounted to a spindle of the associated vehicle.

In another exemplary aspect of the aforementioned fourth embodiment, the tire structural modes are randomly excited during operation of the tire and associated output signals generated by the one or more accelerometers are captured.

In another exemplary aspect of the aforementioned fourth embodiment, the tire structural modes are excited by controlled impacting of the tire with an external object, such as for example a hammer.

In another exemplary aspect of the aforementioned fourth embodiment, the tire structural modes are excited by directing movement of the vehicle with respect to one or more predetermined obstacles, such as for example a cleat or speed bump, or a course comprising a sufficiently rough surface.

An exemplary system in accordance with the fourth embodiment as disclosed herein may implement the vehicle tire wear estimation, for example in view of any one or more of the previously described embodiments and aspects thereof, via a server or server network functionally linked to a data storage network and one or more sensors mounted on the tire and/or the vehicle.

Additional advantageous features are further realized in an exemplary variant on the above-referenced first embodiment, wherein a fifth embodiment of the computer-implemented method is disclosed herein for estimating vehicle tire wear. The method of the fifth embodiment includes one or more sensors, associated with a vehicle and/or at least one tire of a plurality of tires supporting the vehicle, generating first data corresponding to real time kinetics of the vehicle and/or the at least one tire. The first data is locally processed to generate second data as a reduced subset of the first data, wherein the second data is representative of the first data and comprises any one or more predetermined features extracted therefrom. The second data is selectively transmitted to a remote computing system via a communications network, and the remote computing system processes the second data and the any one or more extracted features to estimate a wear characteristic for the at least one tire.

The second data may comprise a plurality of sequential data frames, each data frame comprising a multidimensional histogram of forces associated with the vehicle and/or the at least one tire.

In one exemplary aspect of the aforementioned fifth embodiment, the method further comprises selecting a subset of the data frames between at least first and second events and summarizing the data frames over a particular time or a particular distance.

In another exemplary aspect of this fifth embodiment, the summarizing of the data frames is performed via local processing prior to transmittal of the summarized data frames to the remote computing system. Alternatively, the subset of the data frames may be transmitted to the remote computing system wherein the summarizing of the data frames is performed via the remote computing system.

In another exemplary aspect of this fifth embodiment, the method further comprises correcting for missing data in a summarized data frame by scaling the summarized data frame by an expected number of data frames with respect to an actual collected number of data frames.

The extracted features of the second data may comprise wear performance characteristics representative of vehicle driving behavior.

Processing the first data may comprise performing a Fourier transform on the first data and generating the second data comprising extracted relevant frequencies and associated amplitudes.

In another exemplary aspect of the fifth embodiment, the second data comprises aggregated low frequency CAN data corresponding to an amount of time spent by the vehicle in each of one or more representative driving conditions.

In another aspect of the fifth embodiment, the first data comprises CAN bus signals. The second data is generated via an encoding neural network layer, the third data is generated via a decoding neural network layer, and a wear calculation layer is appended to the output of the decoding neural network layer and configured to transform the decoded CAN bus signals into instantaneous estimated wear values for the at least one tire.

In one exemplary aspect of the aforementioned fifth embodiment, the method further comprises comparing the estimated wear values to actual wear values for the at least one tire to generate an error value, and providing the error value as feedback to the neural network layers.

In another aspect of the fifth embodiment, the selective transmittal of second data is automated and event-based rather than relying upon manual selection for transmittal. Alternatively, the selective transmittal of second data may be time-based.

In another aspect of the fifth embodiment, a method for estimating vehicle tire wear is implemented using one or more sensors associated with a vehicle and/or at least one tire of a plurality of tires supporting the vehicle, wherein first data is generated corresponding to real-time kinetics of the vehicle and/or the at least one tire. Via a global positioning system transceiver, low frequency second data is generated corresponding to vehicle positions. The second data is selectively transmitted to a remote computing system via a communications network, wherein the second data is processed further in view of a vehicle model and one or more vehicle route characteristics to generate third data corresponding to the first data, and the third data is further processed to estimate the wear characteristic for the at least one tire.

In one exemplary aspect of the aforementioned fifth embodiment, the second data further comprises a plurality of sequential data frames, each data frame comprising a multidimensional histogram of forces associated with the vehicle and/or the at least one tire remote computing system. The remote computing system reconstructs a vehicle route from the collected vehicle position data and provides vehicle route feedback into the respective multidimensional histograms.

Additional advantageous features are further realized in an exemplary variant on the above-referenced first embodiment, wherein a sixth embodiment of the computer-implemented method is disclosed herein for estimating vehicle tire wear. First data is generated via one or more sensors associated with a vehicle and/or at least one tire of a plurality of tires supporting the vehicle, the first data corresponding to real-time kinetics of the vehicle and/or the at least one tire. The first data is processed, via a computing system onboard the vehicle, to generate second data as a reduced subset of the first data, said second data representative of the first data and comprising any one or more predetermined features extracted therefrom. The onboard computing system further processes the second data to estimate a wear characteristic for the at least one tire, and generates a notification associated with the estimated wear characteristic to a computing device associated with a vehicle user.

In one exemplary aspect of the aforementioned sixth embodiment, the step of processing the second data to estimate the wear characteristic for the at least one tire comprises processing the second data to generate third data corresponding to the first data, and further processing the third data to estimate the wear characteristic for the at least one tire.

In another exemplary aspect of the aforementioned sixth embodiment, the first data comprises CAN bus signals, the second data is generated via an encoding neural network layer, the third data is generated via a decoding neural network layer, and a wear calculation layer is appended to the output of the decoding neural network layer and configured to transform the decoded CAN bus signals into instantaneous estimated wear values for the at least one tire.

Another exemplary aspect of the aforementioned sixth embodiment further comprises comparing the estimated wear values to actual wear values for the at least one tire to generate an error value, and providing the error value as feedback to the neural network layers.

Additional advantageous features are further realized in an exemplary variant on any one of the above-referenced first through sixth embodiments, wherein a seventh embodiment of the computer-implemented method is disclosed herein for estimating and applying vehicle tire traction status. A method according to the seventh embodiment may include the collecting of vehicle data (e.g., comprising movement data and location data) in association with a first vehicle, and determining a tire wear status for at least one tire associated with the vehicle. One or more tire traction characteristics for the at least one tire are predicted, based at least on the transmitted vehicle data and the determined tire wear status, and one or more vehicle operation settings are selectively modified based on at least the predicted one or more tire traction characteristics.

In one exemplary aspect of the above-referenced seventh embodiment, a maximum speed for the vehicle is determined based on at least on the transmitted vehicle data and a determined tire wear status for each tire associated with the vehicle.

In another exemplary aspect of the above-referenced seventh embodiment, the maximum speed is provided to an autonomous vehicle control system associated with the vehicle. Alternatively, the maximum speed may be provided to a driver assistance interface associated with the vehicle.

In another exemplary aspect of the above-referenced seventh embodiment, one or more tire wear input values are received from a user via a user interface.

In another exemplary aspect of the above-referenced seventh embodiment, the step of determining the tire wear status comprises receiving one or more tire wear input values generated by one or more sensors mounted in or on a respective tire of the at least one tire. Alternatively, the one or more tire wear input values may be generated by a sensor external to the vehicle.

In another exemplary aspect of the above-referenced seventh embodiment, the step of determining the tire wear status comprises predicting one or more tire wear input values based on at least the transmitted vehicle data and on tire data generated by one or more sensors mounted in or on a respective tire of the at least one tire.

A system may be provided for performing the method according to the above-referenced seventh embodiment and optionally further according to certain of the exemplary aspects, the system comprising a remote server functionally linked to the vehicle via a communications network, wherein the vehicle data is transmitted from the vehicle to the remote server. The remote server is configured to provide the one or more predicted tire traction characteristics to an active safety unit associated with the vehicle, and the active safety unit is configured to modify the one or more vehicle operation settings based on at least the predicted one or more tire traction characteristics.

In an exemplary aspect of the system according to the seventh embodiment, the active safety unit may comprise an automated braking system associated with the vehicle, and the remote server is configured to provide one or more parameters of a predicted mu-slip curve associated with a respective tire to the automated braking system.

In another exemplary aspect of the system according to the seventh embodiment, a user interface is associated with the remote server and configured to receive one or more tire wear input values from a user.

In another exemplary aspect of the system according to the seventh embodiment, the remote server is configured to determine a maximum speed for the vehicle based on at least on the transmitted vehicle data and a determined tire wear status for each tire associated with the vehicle, and provide the maximum speed to a driver assistance interface associated with the vehicle.

In other exemplary aspects of the system according to the seventh embodiment, the active safety unit may comprise a collision avoidance system and/or an autonomous vehicle control system.

Another example of a system may perform the method according to the seventh embodiment as described above, for each of a plurality of vehicles, and optionally further according to certain of the exemplary aspects associated therewith. This system comprises a first remote server functionally linked to the vehicle via a communications network, a fleet management server functionally linked to the first remote server, and a vehicle control system associated with each of a plurality of vehicles. For each of the plurality of vehicles, vehicle data is transmitted from the respective vehicle to the remote server, the first remote server is configured to provide the one or more predicted tire traction characteristics to the fleet management server, and the fleet management server is configured to interact with the respective vehicle control system for modifying the one or more vehicle operation settings based on at least the predicted one or more tire traction characteristics.

In one exemplary aspect of this system, a user interface is associated with the remote server and/or the fleet management server and/or the vehicle control system, and configured to receive one or more tire wear input values from a user.

In another exemplary aspect of this system, the fleet management server is configured to determine a maximum speed for a given vehicle based on at least on the transmitted vehicle data and a determined tire wear status for each tire associated with the respective vehicle, and provide the maximum speed to the vehicle control system associated with the vehicle.

In another exemplary aspect of this system, the fleet management server is configured to calculate a stopping distance potential for a given vehicle based on at least on the transmitted vehicle data and a determined tire wear status for each tire associated with the vehicle, and provide the stopping distance potential to the vehicle control system associated with the vehicle.

In another exemplary aspect of this system, the fleet management server is further configured to determine an optimal following distance for each of a plurality of vehicles associated with a platoon of vehicles travelling in sequence, and transmit the determined optimal following distance for each one of the plurality of vehicles to the respective vehicle control system.

In another exemplary aspect of this system, the fleet management server is configured to determine a maximum speed and/or stopping distance potential for a given vehicle based on at least on the transmitted vehicle data and a determined tire wear status for each tire associated with the respective vehicle, determine whether the vehicle satisfies threshold traction characteristics, and interact with the vehicle control system to prevent deployment of, or otherwise remove from use, the respective vehicle if the vehicle does not satisfy the threshold traction characteristics.

Various ones of the above-referenced embodiments may be readily combinable with each other in a system and/or method as disclosed herein.

For example, one of skill may appreciate that a predicted tire wear according to the third embodiment or the fourth embodiment may be provided as an output to a traction model according to the seventh embodiment, complementary to each other without altering the scope of the respective steps or features.

Further, one of skill in the art may appreciate that extracted data according to the fifth embodiment may be provided as input to tire wear models according to one or more other embodiments as disclosed herein.

BRIEF DESCRIPTION OF THE SEVERAL VIEWS OF THE DRAWINGS

Hereinafter, embodiments of the invention are illustrated in more detail with reference to the drawings.

DETAILED DESCRIPTION

Figure 1:
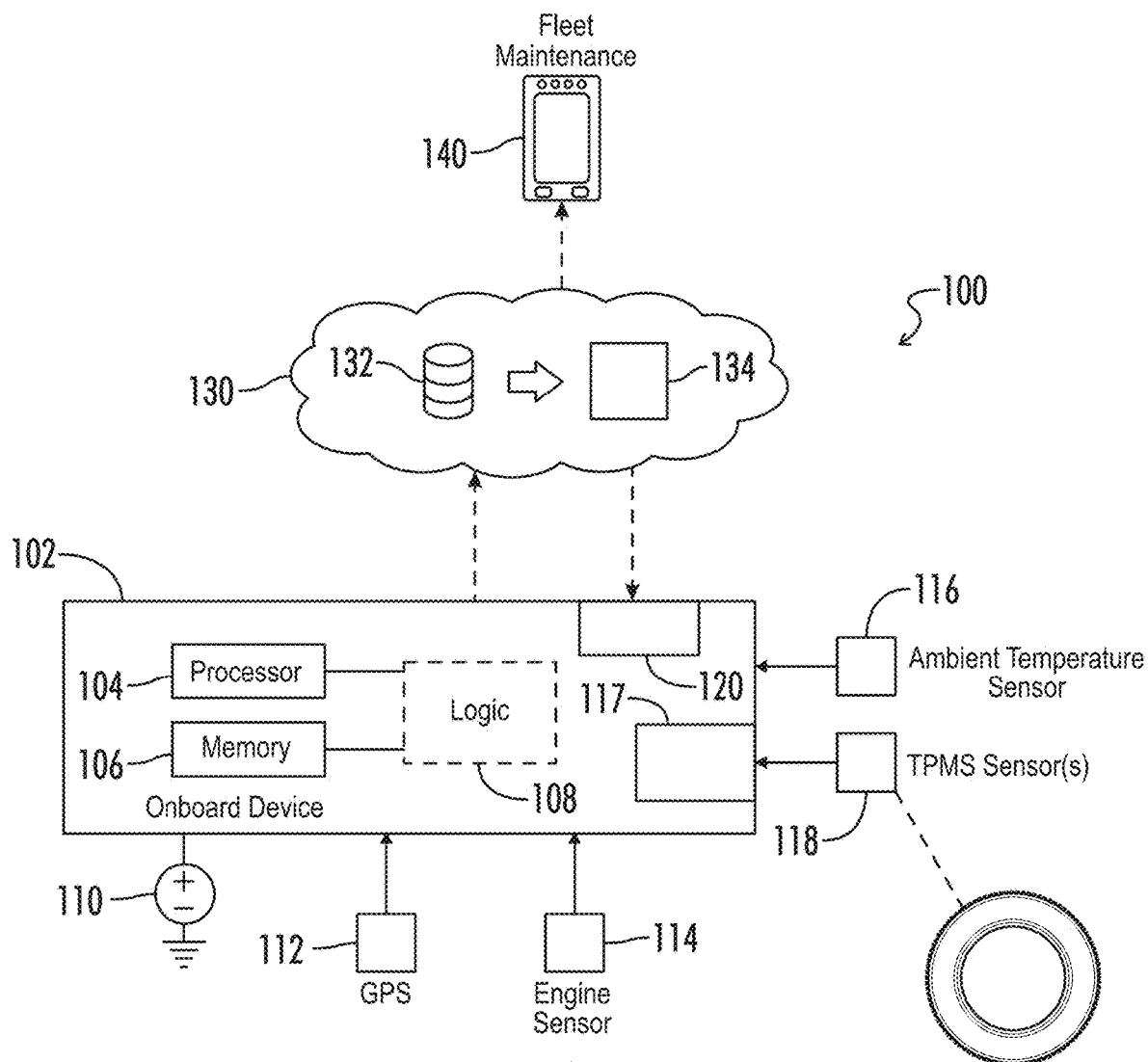
FIG. 1 is a block diagram representing an exemplary embodiment of a system according to various embodiments as disclosed herein.

Referring generally to FIGS. 1-29, various exemplary embodiments of an invention may now be described in detail. Where the various figures may describe embodiments sharing various common elements and features with other embodiments, similar elements and features are given the same reference numerals and redundant description thereof may be omitted below.

Various embodiments of a system as disclosed herein may include centralized computing nodes (e.g., a cloud server) in functional communication with a plurality of distributed data collectors and computing nodes (e.g., associated with individual vehicles) for effectively implementing wear and traction models as disclosed herein. Referring initially to FIG. 1, an exemplary embodiment of the system 100 includes a computing device 102 that is onboard a vehicle and configured to at least obtain data and transmit said data to a remote server 130 and/or perform relevant computations as disclosed herein. The computing device may be portable or otherwise modular as part of a distributed vehicle data collection and control system (as shown), or otherwise may be integrally provided with respect to a central vehicle data collection control system (not shown). The device may include a processor 104 and memory 106 having program logic 108 residing thereon. Generally stated, a system as disclosed herein may implement numerous components distributed across one or more vehicles, for example but not necessarily associated with a fleet management entity, and further a central server or server network in functional communication with each of the vehicles via a communications network. The vehicle components may typically include one or more sensors such as, e.g., vehicle body accelerometers, gyroscopes, inertial measurement units (IMU), position sensors such as global positioning system (GPS) transponders 112, tire pressure monitoring system (TPMS) sensor transmitters 118 and associated onboard receivers, or the like, as linked for example to a controller area network (CAN) bus network and providing signals thereby to local processing units. The illustrated embodiment includes for illustrative purposes, without otherwise limiting the scope of the present invention thereby, an ambient temperature sensor 116, an engine sensor 114 configured for example to provide sensed barometric pressure signals, and a DC power source 110.

In view of the following discussion, other sensors for collecting and transmitting vehicle data such as pertaining to velocity, acceleration, braking characteristics, or the like will become sufficiently apparent to one of ordinary skill in the art and are not further discussed herein. Various bus interfaces, protocols, and associated networks are well known in the art for the communication of vehicle kinetics data or the like between the respective data source and the local computing device, and one of skill in the art would recognize a wide range of such tools and means for implementing the same.

The system may include additional distributed program logic such as for example residing on a fleet management server or other computing device 140, or a user interface of a device resident to the vehicle or associated with a driver thereof (not shown) for real-time notifications (e.g., via a visual and/or audio indicator), with the fleet management device in some embodiments being functionally linked to the onboard device via a communications network. System programming information may for example be provided on-board by the driver or from a fleet manager.

Vehicle and tire sensors may in an embodiment further be provided with unique identifiers, wherein the onboard device processor 104 can distinguish between signals provided from respective sensors on the same vehicle, and further in certain embodiments wherein a central server 130 and/or fleet maintenance supervisor client device 140 may distinguish between signals provided from tires and associated vehicle and/or tire sensors across a plurality of vehicles. In other words, sensor output values may in various embodiments be associated with a particular tire, a particular vehicle, and/or a particular tire-vehicle system for the purposes of onboard or remote/downstream data storage and implementation for calculations as disclosed herein. The onboard device processor may communicate directly with the hosted server as shown in FIG. 1, or alternatively the driver's mobile device or truck-mounted computing device may be configured to receive and process/transmit onboard device output data to the hosted server and/or fleet management server/device.

Signals received from a particular vehicle and/or tire sensor may be stored in onboard device memory, or an equivalent data storage unit functionally linked to the onboard device processor, for selective retrieval as needed for calculations according to the method disclosed herein. In some embodiments, raw data signals from the various signals may be communicated substantially in real time from the vehicle to the server. Alternatively, particularly in view of the inherent inefficiencies in continuous data transmission of high frequency data, the data may for example be compiled, encoded, and/or summarized for more efficient (e.g., periodic time-based or alternatively defined event-based) transmission from the vehicle to the remote server via an appropriate communications network.

The vehicle data and/or tire data, once transmitted via a communications network to the hosted server 130, may be stored for example in a database 132 associated therewith. The server may include or otherwise be associated with tire wear models and tire traction models 134 for selectively retrieving and processing the vehicle data and/or tire data as appropriate inputs. The models may be implemented at least in part via execution of a processor, enabling selective retrieval of the vehicle data and/or tire data and further in electronic communication for the input of any additional data or algorithms from a database, lookup table, or the like that is stored in association with the server.

In an embodiment of a method as disclosed herein, a system 100 as described above may be implemented for modeling and predicting of tire performance and the provision of feedback based thereon. The method may include collecting vehicle data comprising movement data and/or location data for a vehicle and/or at least one tire associated with the vehicle, and determining a current tire wear status in real-time for the at least one tire, based at least in part on the collected data. One or more tire performance characteristics are predicted, based at least in part on the determined tire wear status and the collected data. Real-time feedback is selectively provided, based on the predicted one or more tire performance characteristics and/or determined current tire wear status. In various embodiments as disclosed herein, some or all of these steps may be expanded upon as discussed below to provide further advantages.

Figure 2:
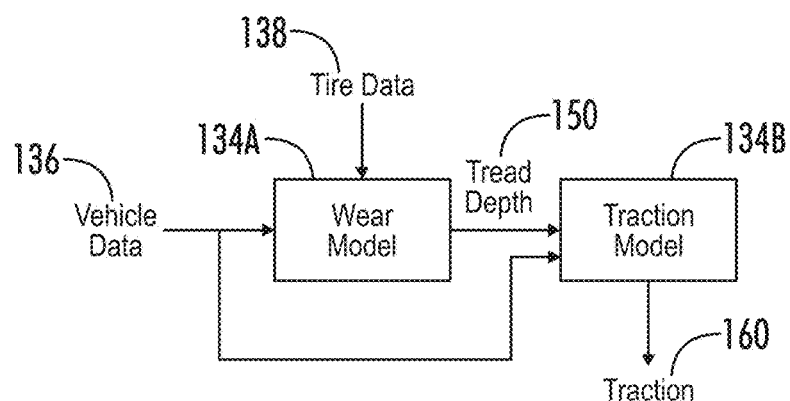
FIG. 2 is a block diagram representing an exemplary traction estimation model.

For example, referring next to FIG. 2, an embodiment of a system and method as disclosed herein implements a simplified model 134B of a tire along with the tire's wear state 150 to predict its traction capabilities 160, which is relayed to the user to promote safe driving. The simplified model predicts the forces and moments on the tire under a given friction, load, inflation pressure, speed, etc. The terms "tire wear" and "tread wear" may be used herein interchangeably for the purpose of illustration.

For the traction model 134B to be accurate, especially for wet conditions, the tread depth 150 must be known/estimated. This may be accomplished by any of several exemplary techniques as follows.

In one embodiment, tire wear (tread) measurements 150 may be made manually by the user and provided as user input into an app or equivalent interface associated with the onboard computing device 102 or directly with the hosted server 130. The interface may for example enable direct input of wear values by the user with respect to a selected tire from among a plurality of tires mounted on an identified vehicle. Alternatively, the interface may be configured to prompt the user for a captured image or alternative input associated with a tread profile, wherein the wear values may be indirectly determined from the user input.

In another embodiment, tire wear measurements 150 may be made by a tire-mounted sensor and provided to the hosted server, for example without requiring input from the user. Such sensors may for example be mounted directly in the tire tread.

In another embodiment, tire wear measurements 150 may be provided via one or more sensors external to the vehicle and sent to the cloud server 130, again for example without requiring input from the user. As one example, the one or more sensors may include a drive-over optical sensor comprising a laser emitter configured to capture tire tread information by projecting laser light onto or across a surface of the tire passing over the sensor, and one or more laser receiving elements configured to capture reflected energy and thereby acquire a profile of the tire from which the tire tread may be determined.

In another embodiment, as represented for example in FIG. 2 and examples of which are provided in various embodiments below, tire wear values 150 may be estimated based on a wear model 134A. The wear model may comprise "digital twin" virtual representations of various physical parts, processes or systems wherein digital and physical data is paired and combined with learning systems such as for example neural networks. For example, real data 136 from a vehicle and associated location/route information may be provided to generate a digital representation of the vehicle tire for estimation of tire wear, wherein subsequent comparison of the estimated tire wear with a determined actual tire wear may be implemented as feedback for the machine learning algorithms. The wear model 134A may be implemented at the vehicle, for processing via the onboard system 102, or the tire data 138 and/or vehicle data 136 may be processed to provide representative data to the hosted server 130 for remote wear estimation.

The tire wear status (e.g., tread depth) 150 as shown in FIG. 2 may for example be provided along with certain vehicle data 136 as inputs to the traction model 134B, which may be configured to provide an estimated traction status 160 or one or more traction characteristics 160 for the respective tire. As with the aforementioned wear model, the traction model may comprise "digital twin" virtual representations of physical parts, processes or systems wherein digital and physical data are paired and combined with learning systems such as for example artificial neural networks. Real vehicle data 136 and/or tire data 138 from a particular tire, vehicle or tire-vehicle system may be provided throughout the life cycle of the respective asset to generate a virtual representation of the vehicle tire for estimation of tire traction, wherein subsequent comparison of the estimated tire traction with a corresponding measured or determined actual tire traction may preferably be implemented as feedback for machine learning algorithms executed at the server level.

The traction model 134B may in various embodiments utilize the results from prior testing, including for example stopping distance testing results, tire traction testing results, etc., as collected with respect to numerous tire-vehicle systems and associated combinations of values for input parameters (e.g., tire tread, inflation pressure, road surface characteristics, vehicle speed and acceleration, slip rate and angle, normal force, braking pressure and load), wherein a tire traction output may be effectively predicted for a given set of current vehicle data and tire data inputs.

In one embodiment, the outputs 160 from this traction model 134B may be incorporated into an active safety system. As previously noted, data is being collected from sensors on the vehicle to feed into the tire wear model 134A which will predict tread depth 150, and this will be fed into the traction model 134B. The term "active safety systems" as used herein may preferably encompass such systems as are generally known to one of skill in the art, including but not limited to examples such as collision avoidance systems, advanced driver-assistance systems (ADAS), anti-lock braking systems (ABS), etc., which can be configured to utilize the traction model output information 160 to achieve optimal performance. For example, collision avoidance systems are typically configured to take evasive action, such as automatically engaging the brakes of a host vehicle to avoid or mitigate a potential collision with a target vehicle, and enhanced information regarding the traction capabilities of the tires and accordingly the braking capabilities of the tire-vehicle system are eminently desirable.

Figure 3:
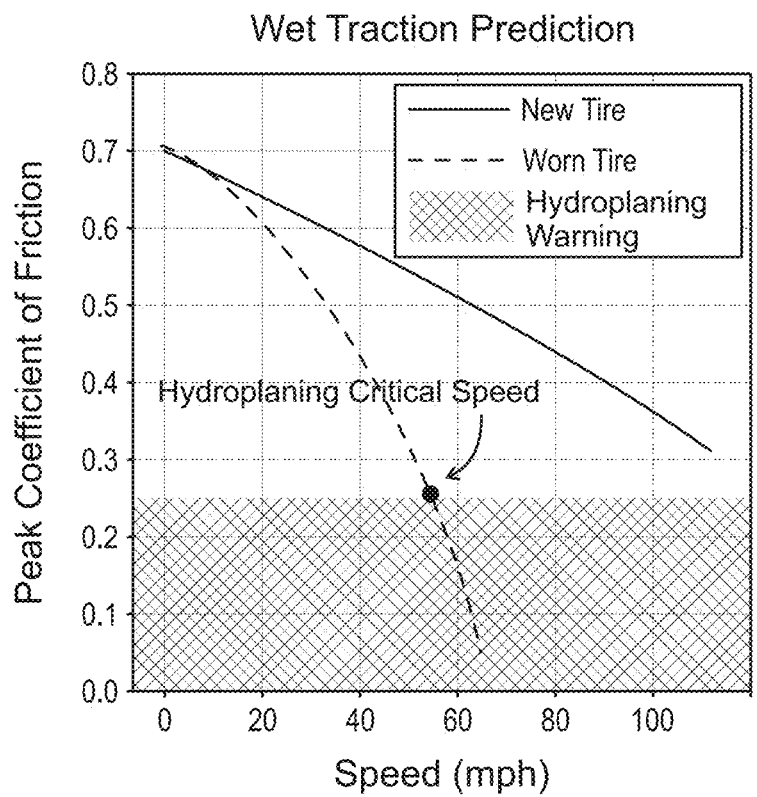
FIG. 3 is a graphical diagram representing an exemplary set of traction characteristics produced by a model as disclosed herein.
Figure 4:
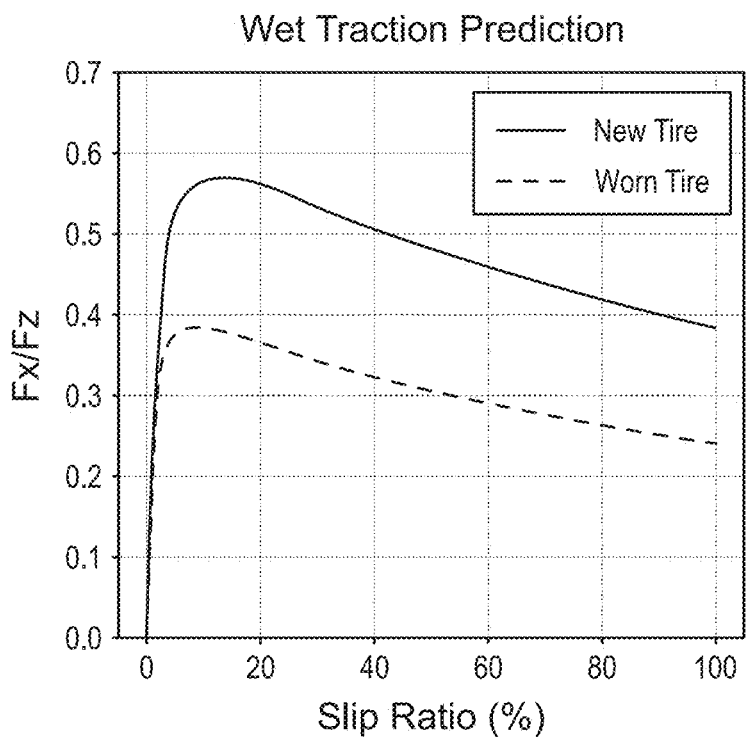
FIG. 4 is a graphical diagram representing another exemplary set of traction characteristics produced by a model as disclosed herein.

By reference to exemplary models as shown in FIGS. 3 and 4, each graph includes two curves representing the same hypothetical tire at different wear levels. As can be seen, as the tire wears the wet traction performance deteriorates accordingly. During inclement weather, there is a critical speed for worn tires wherein the user risks hydroplaning With a traction model linked remotely to an onboard display or equivalent user interface, a maximum speed can be communicated to the user to provide safer driving conditions.

Traction output information, such as for example mu-slip curves (See, e.g., FIG. 4) determined according to the respective wear states, may also be fed into the active safety systems for vehicle control implementation and thereby optimized performance. The slip ratio represents ((vehicle speed−tire rotation speed)/vehicle speed), wherein a slip ratio of 0% corresponds to a free rolling tire and a slip ratio of 100% corresponds to a locked wheel. As the tire mu-slip curve shapes are altered over time from a "New Tire" curve to a "Worn Tire" curve as represented in FIG. 4, the active safety system may preferably be configured to determine what, if any, changes could be made to improve tire-vehicle performance characteristics. Different mu-slip curves may be considered to possess relevant shape and location characteristics which influence the ability of an active safety system (e.g., the ABS) to optimize performance, wherein for example the respective peak amplitude "mu" is generally understood to influence the stopping distance (the higher the better). Other relevant characteristics of the mu-slip curve shape may include, for example, the slip ratio at the y-axis (mu) peak of the curve, the curvature at or proximate to said peak, the initial slope of the curve, etc.

Figure 5:
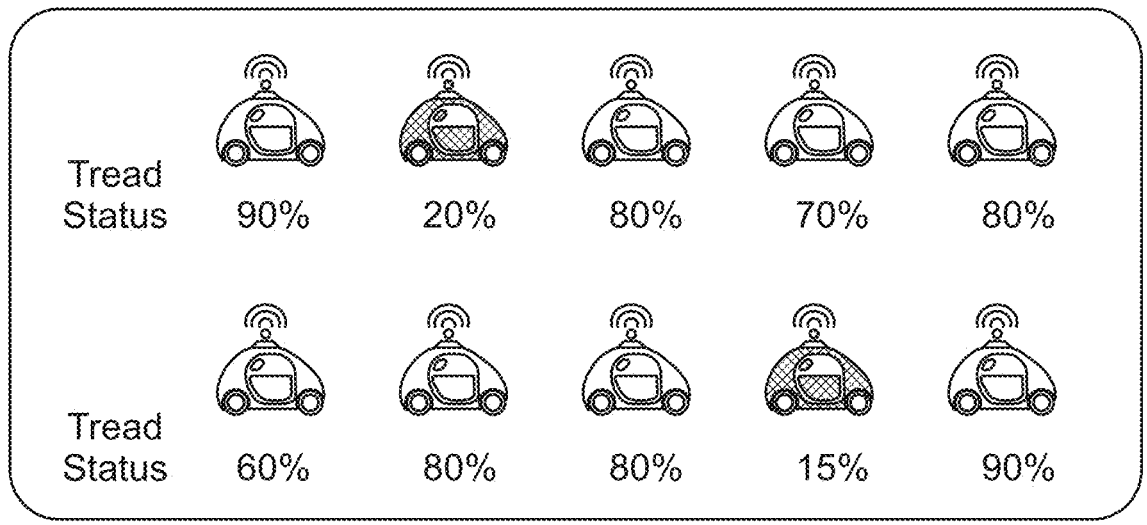
FIG. 5 is a graphical diagram representing an exemplary set of tire wear (e.g., tread) status values for an autonomous car fleet.
Figure 6:
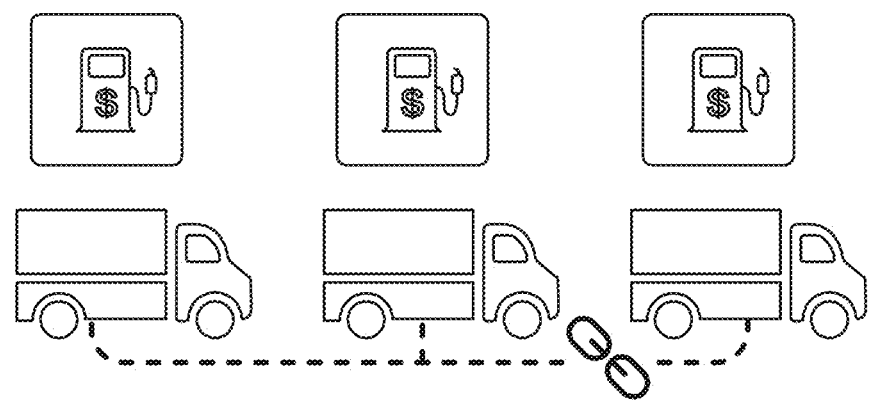
FIG. 6 is a graphical diagram representing an exemplary application for tire wear (e.g., tread) status values and predicted tire traction values for a truck platoon.

In another embodiment, a ride-sharing autonomous fleet could use output data 160 from the traction model 134B to disable or otherwise selectively remove vehicles with low tread depth from use during inclement weather, or potentially to limit their maximum speeds. By reference to the exemplary model as represented in FIG. 3, it may be noted that a tire with a "worn" state is identified with a hydroplaning critical speed of ~55 miles per hour at which a peak coefficient of friction falls below the threshold of 0.25, as compared to a tire with a "new" state which may exceed 100 miles per hour without the peak coefficient of friction falling below the same threshold. The system may accordingly limit the speed of a vehicle including one or more tires worn to such a state. If the vehicle is part of a ride-sharing autonomous fleet, and a user is seeking a ride during severe weather conditions along a route that requires elevated minimum (e.g., highway) speeds, the system may be configured to disable deployment of vehicles below a certain tread depth or otherwise having insufficient traction capabilities. As shown in FIG. 5, an exemplary autonomous vehicle fleet may comprise numerous vehicles having varying minimum tread status values, wherein the fleet management system may be configured to disable deployment of vehicles falling below a minimum threshold. The system may be configured to act upon a minimum tire tread value for each of a plurality of tires associated with a vehicle, or in an embodiment may calculate an aggregated tread status for the plurality of tires for comparison against a minimum threshold.

In another embodiment, a fleet management system may implement the output data 160 from the traction model 134B with respect to a defined platoon of vehicles, such as to better optimize their following distances to achieve maximum fuel savings by better understanding each tire's stopping distance potential. One of skill in the art may appreciate that minimizing following distances can result in reduced aerodynamic drag for all vehicles in a platoon and thereby improve respective fuel economies, particularly where more than two trucks are included in the platoon, and the disclosed improvements to vehicle platooning methods can desirably facilitate the reduction of following distances beyond a more conventional "one size fits all" approach. The most fuel savings may typically be obtained at following distances of less than ~20 meters, a distance which may be difficult or impossible to maintain during poor weather using conventional techniques for determining traction/braking capabilities. By more effectively determining a safe following distance, even for inclement weather conditions, the percentage of time spent platooning may also be increased.

In an embodiment, the active safety or platoon following distance information may be provided to a vehicle braking control system or vehicle platooning control system 120 associated with each respective vehicle. In the context of a vehicle platoon, it may be that a single vehicle associated with the platoon receives following distance information and/or certain vehicle control information and passes along the information to other vehicles in the platoon via otherwise conventional vehicle-to-vehicle communication systems and protocols. The following distance information provided by the system as disclosed herein may be considered for example a nominal or minimum effective following distance setting based on the respective traction status for vehicles in a platoon, with the understanding that the vehicle platooning control system for a given vehicle or platoon of vehicles may further alter the following distance settings based on monitored traffic events, road conditions, and other ambient conditions that may be outside the scope of the traction status determinations for a given embodiment. For example, a first following distance which may be acceptable for a given vehicle under normal driving conditions may necessarily be increased based on monitored real time events such as a change in grade of the road to be traversed, or a heightened risk of braking events by any one or more vehicles in the platoon.

Components of a vehicle platooning control system 120 are generally known in the art, and may include for example vehicle braking control systems, collision mitigation systems, vehicle-to-vehicle communications, and one or more sensors collectively configured to monitor vehicle data such as a current following distance of the host vehicle (with respect to another vehicle in the platoon or a non-platooning target vehicle), a respective type of said target vehicle, a relative acceleration or deceleration value for the host vehicle, a pressure value with respect to a braking actuator for the host vehicle, etc.

As previously noted, various embodiments of a method may estimate tire wear values 150 based on a wear model 134A. Current wear models require several inputs about the system to accurately project out the wear life of the tire and are developed using very high frequency data. However, transmitting high frequency data from distributed data collectors (e.g., associated with individual vehicles) to centralized computing nodes (e.g., cloud servers) is prohibitively expensive at scale.

Figure 7:
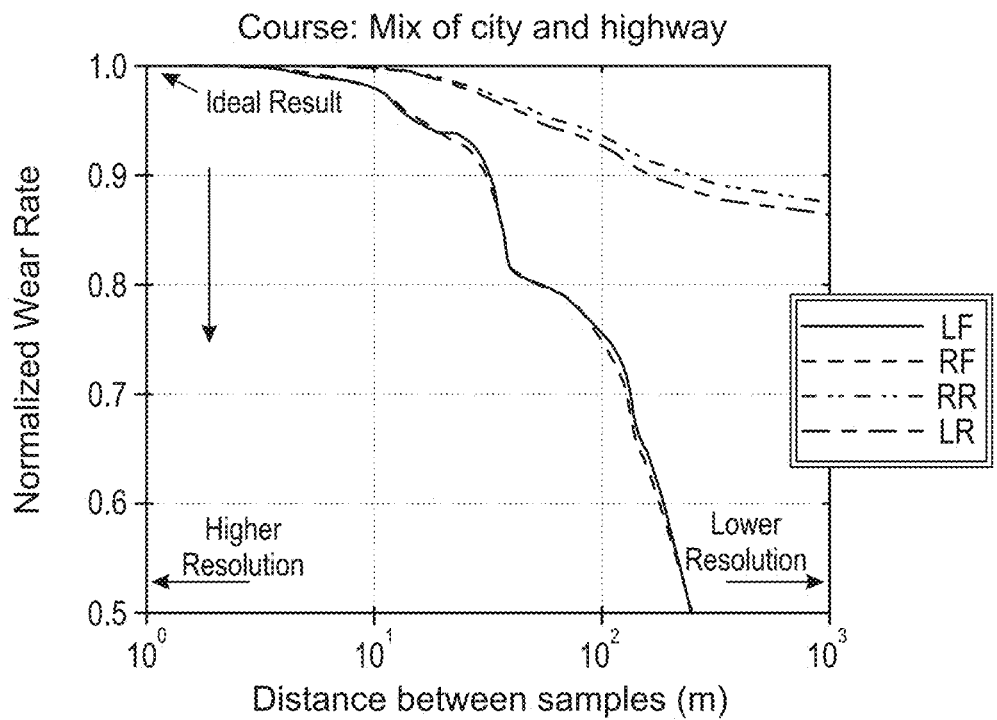
FIG. 7 is a graphical diagram illustrating the effect of signal resolution on wear rate estimations, using signals collected during a mix of city and highway vehicle routes.
Figure 8:
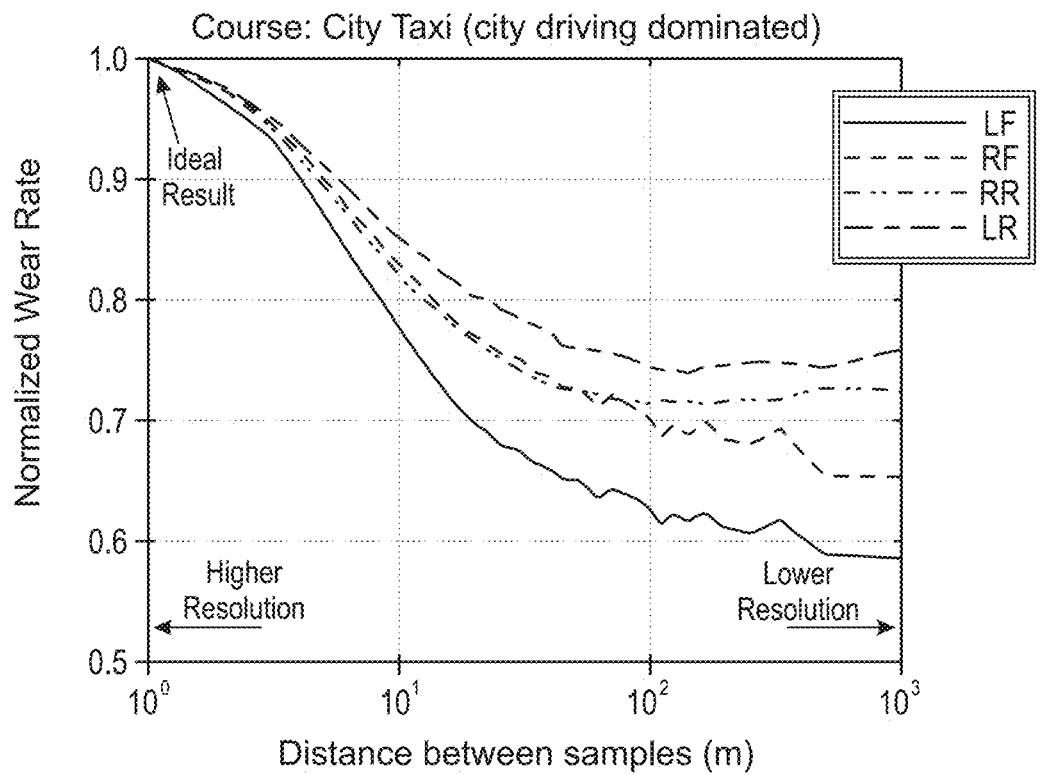
FIG. 8 is a graphical diagram illustrating the effect of signal resolution on wear rate estimations, using signals collected primarily during city routes.

Referring for illustrative purposes to FIGS. 7 and 8, the data presented therein illustrates the effect of signal resolution on wear rate estimations. To construct these plots the source data is down sampled to reduce the resolution of the data. The down sampling in these examples is performed by simply decimating the source data. The source data has a resolution of one meter per sample in the distance domain, or roughly 20 Hz at a speed of 45 mph. The x-axis shows a range of one meter per sample up to one thousand meters per sample. The y-axis shows the relative error in the wear estimation.

In both figures, the data sets respectively correspond to all four tires of a Toyota Camry front wheel drive vehicle, using Turanza EL400 All-Season tires. In FIG. 7, the data is representative of an "average North American driver" on a mixture of city and highway roads, wherein a lower predicted wear rate generally corresponds to a lower accuracy in wear prediction. In FIG. 8, the data is representative of a city taxi fleet, wherein the vast majority of the mileage is in city driving contexts and a higher sampling rate is clearly required relative to the previous data sets.

The results as shown indicate that simple down sampling of the data is not a reliable, robust, and efficient method of reducing data storage and transmission requirements. The minimum resolution needed to achieve good prediction is strongly dependent on the route driven (e.g., city dominated or mixed city and highway) and driving style. In addition, the minimum resolution needed is also dependent on the tire's position on the vehicle (e.g., left-front, right-front, etc.).

Therefore, one of skill in the art may appreciate the desirability of more complex strategies maximize vehicle kinetics data storage and transmission efficiencies for tire wear estimation.

Exemplary tire wear models 134A as disclosed herein may summarize data from high frequency or alternative low frequency sources into low frequency data, such as route data, which can be transmitted at this lower frequency to the cloud in a cost-effective manner, enabling direct wear modeling. In certain embodiments, improved efficiencies can be achieved with adaptive solutions to make the methods more robust and adaptive to field conditions, e.g., by encoding wear estimation features into a compressed/reduced dataset.

In an embodiment, real-time vehicle kinetics data may be collected from sensors on a vehicle, and then filtered and down sampled into summarized buckets to create a histogram of the relevant forces. For example, raw accelerometer data may be down sampled and aggregated into a histogram that is representative of the raw data but at a coarse level.

Figure 9:
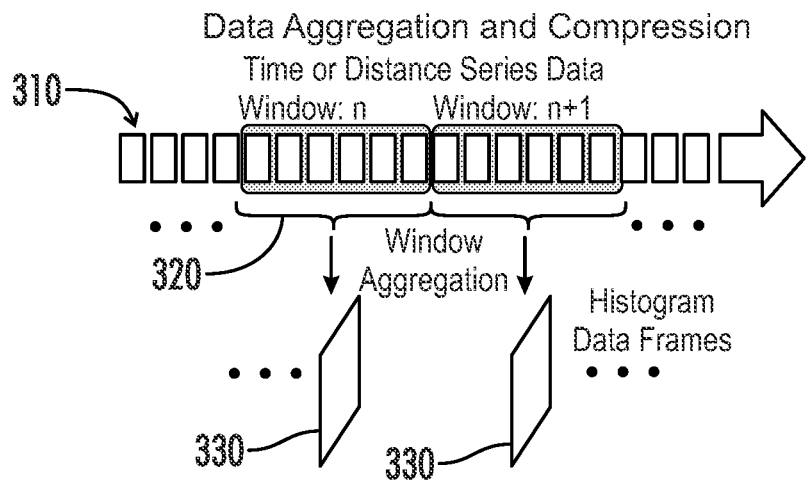
FIG. 9 is a graphical diagram representing an exemplary process for vehicle kinetics data aggregation and compression into histogram data frames.

As represented for example in FIG. 9, the real-time vehicle kinetics data 310 may be compiled into windows 320 of time and/or distance. The compiled data may further be aggregated into histogram data frames 330. The data frames 330 in the illustrated embodiment are multi-dimensional and contain vehicle body accelerations and vehicle body speed. Each point in the histogram represents the time or distance spent in that condition. The bins of the histogram may be optimized to maximize wear calculation accuracy and to further minimize data storage and transfer costs, for example implementing simple equally spaced or non-linear bin layouts.

Figure 10:
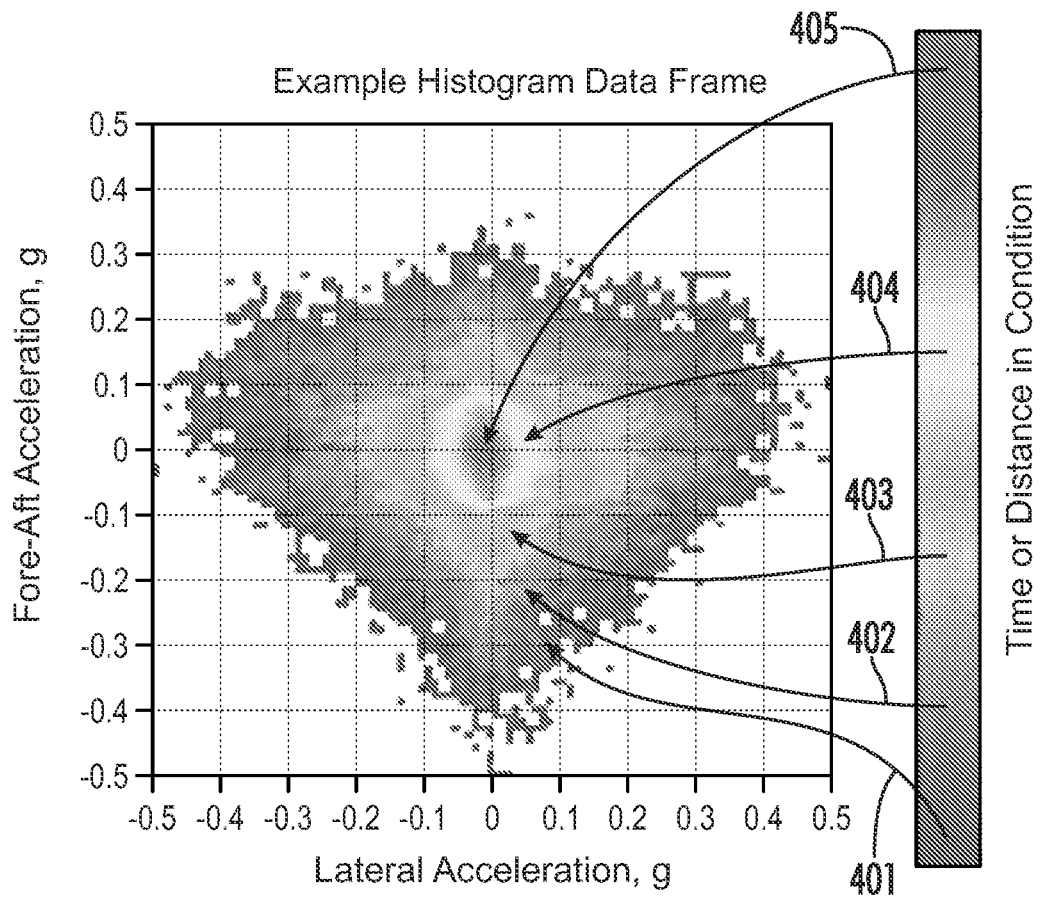
FIG. 10 is a graphical diagram representing an exemplary histogram data frame according to the process of FIG. 9.

FIG. 10 illustrates an example of a histogram data frame having a first dimension associated with lateral vehicle acceleration, and a second dimension associated with fore-aft vehicle acceleration. The individual points in this example are color-coded to represent a time or distance spent in the corresponding condition.

Figure 11:
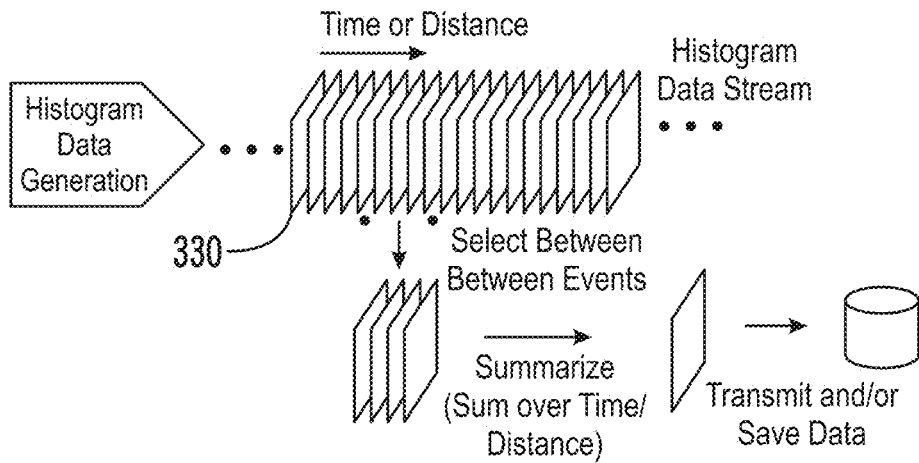
FIG. 11 is a graphical diagram representing an exemplary process for histogram data summarization.

Referring next to FIG. 11, as wear is a cumulative process it is useful to summarize data between specific events in time and/or distance. Examples of relevant events may include without limitation: by vehicle trip, tire tread depth measurement events, tire rotation events, tire mount events, vehicle maintenance events, daily/monthly/yearly summaries, mileage summaries (5k, 10k, 20k miles, etc. . . . ). Histogram data frames 330 allow for flexible and efficient summarization, which can be used on static data in the cloud (after transfer) or on transient data on the vehicle (before the data is transferred).

Unfortunately, data from vehicle systems and communication systems are often, or even inherently, unreliable. One of skill in the art may appreciate the desirability of designing software systems to be predictable and robust in cases where data is missing or corrupt. Since wear is a cumulative process, missing data poses a problem for wear calculations. Histogram data frames 330 as disclosed in accordance with the present embodiment allow for efficient compensation for missing data.

Figure 12:
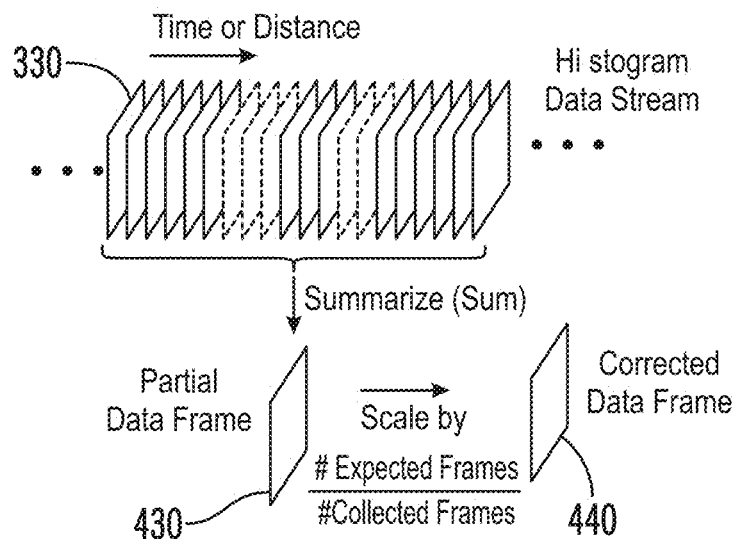
FIG. 12 is a graphical diagram representing an exemplary process for histogram data frame scaling to correct for missing or incomplete data.

Referring next to FIG. 12, a plurality of histogram data frames 330 having a missing subset of data therein may be summarized to generate a partial data frame 430, which may further be corrected by scaling the data frame by the expected number of data frames with respect to the collected number data frames. The result (corrected data frame 440) will be an average of the driver's behavior.

Figure 13:
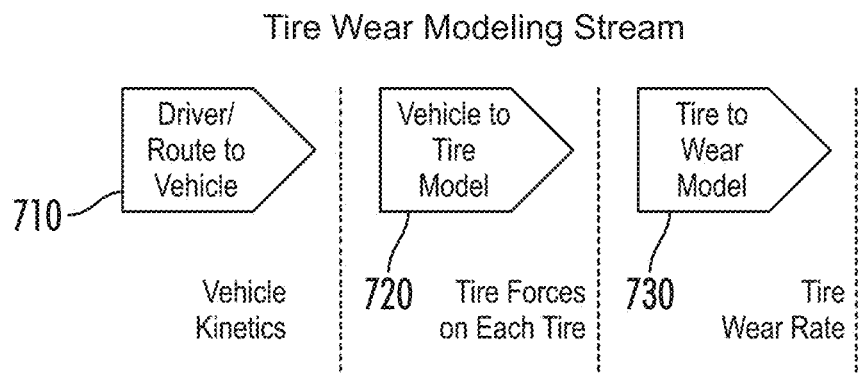
FIG. 13 is a graphical diagram representing an exemplary tire wear modeling stream.
Figure 14:
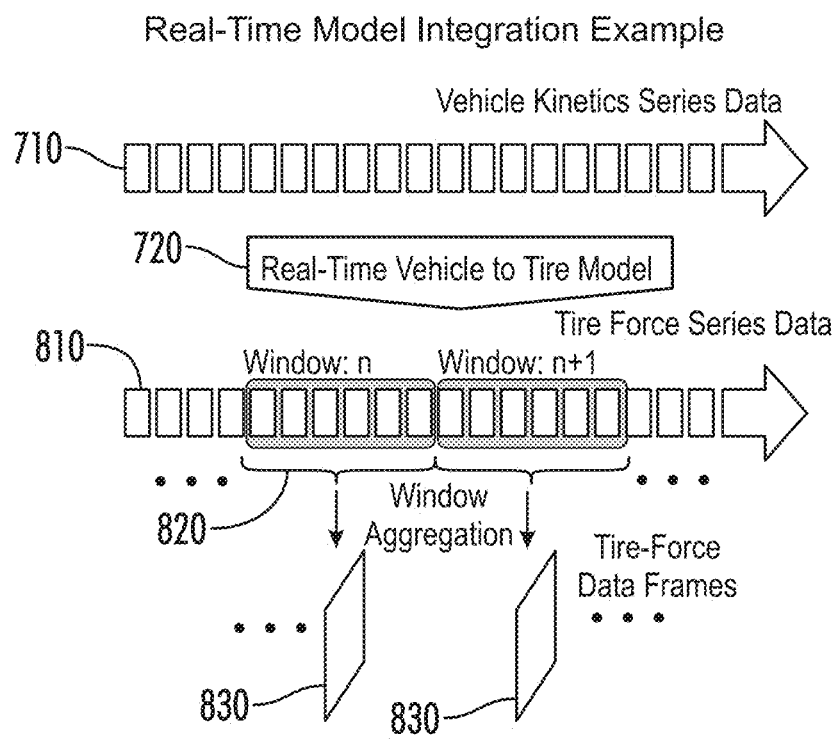
FIG. 14 is a graphical diagram representing an exemplary real-time model integration according to the tire wear modeling stream of FIG. 13.

As previously noted, and with further reference now to a tire wear modeling stream as represented in FIG. 13 and an exemplary real-time model integration as represented in FIG. 14, vehicle kinetics series data 710 may be acquired using one or more sensors on or associated with the vehicle. A real-time vehicle to tire model 720 can then be used to simulate tire forces on each tire. Furthermore, a model of the tire can be utilized to produce wear rate simulations 730. Both such models can be implemented either in real-time on time/distance series data or on the aggregated data frames. Simulation results of the model can be stored or transmitted in data frame form.

The example in FIG. 14 shows real-time simulation of tire forces and transmission of tire force data frames 830. The scope of the present embodiment is not necessarily limited thereto, and one of skill in the art may appreciate alternative strategies for various use cases.

It should be noted that whereas numerous embodiments as disclosed herein simulate forces on each tire based on vehicle kinetics data, the scope of the invention is not limited thereto unless otherwise specifically stated. In other words, it is within the scope of the invention to provide raw data corresponding to one or more forces applied to at least one tire if such data is available in a given application.

In another embodiment of a method as disclosed herein, the vehicle kinetics data may be filtered, down sampled and aggregated into a subset of behavioral or "driver severity" values that are representative of how the vehicle is driven. These values are extracted from the raw data to specifically capture predetermined wear performance characteristics of the driver's behavior. The extracted behavioral features are further processed by the downstream (e.g., host server-based) wear model. Behavioral values as features extracted from the raw data prior to transmittal into the cloud may optionally supplement or otherwise complement other forms of summarized or compressed data in accordance with other embodiments as disclosed herein.

In another embodiment, low frequency GPS data from the vehicle may be transmitted to the cloud server, wherein the route is reconstructed with a reverse mapping algorithm and fed into a time series histogram to understand the time spent in various driving conditions (highway, turning, braking, etc.). As with the aforementioned embodiment, vehicle position data collected or extracted prior to transmittal into the cloud may optionally supplement or otherwise complement other forms of summarized or compressed data in accordance with other embodiments as disclosed herein.

In another embodiment, low frequency CAN data may be aggregated to count the time spent in various driving conditions that is used to calculate wear state. As with the two previous embodiments, feature extraction in the form of event-based driving detection prior to transmittal into the cloud may optionally supplement or otherwise complement other forms of summarized or compressed data in accordance with one or more other embodiments as disclosed herein.

Figure 15:
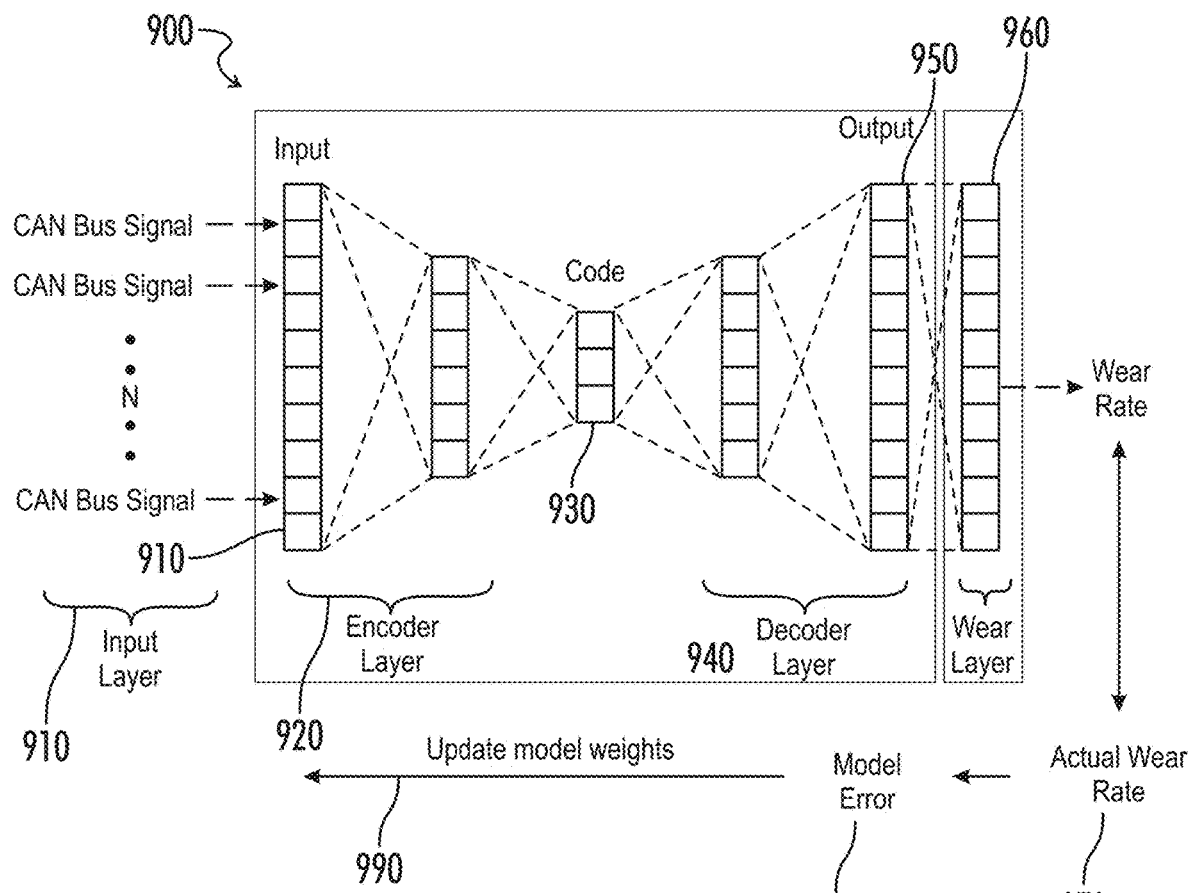
FIG. 15 is a graphical diagram representing an exemplary neural network autoencoder application to tire wear.
Figure 16A:
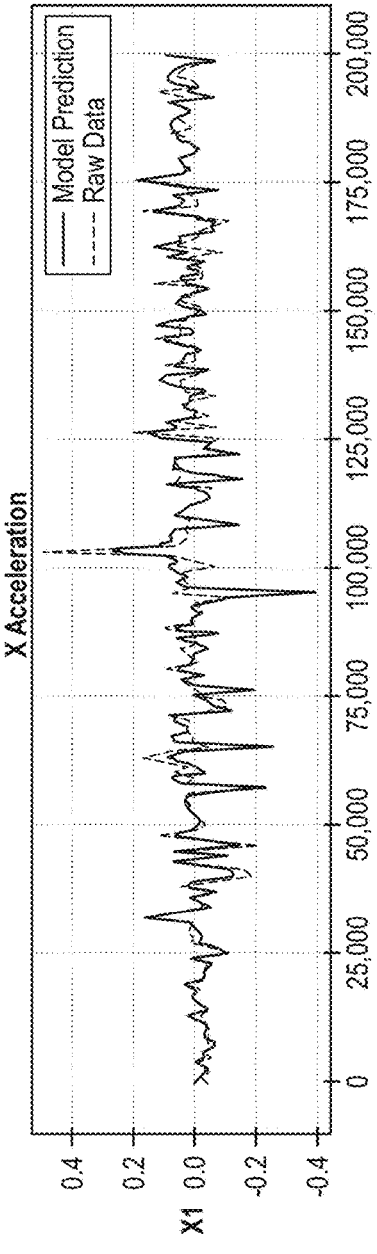
FIG. 16A is a graphical diagram representing exemplary results of neural network autoencoder compression and decompression of x-axis acceleration data according to the example of FIG. 15.
Figure 16B:
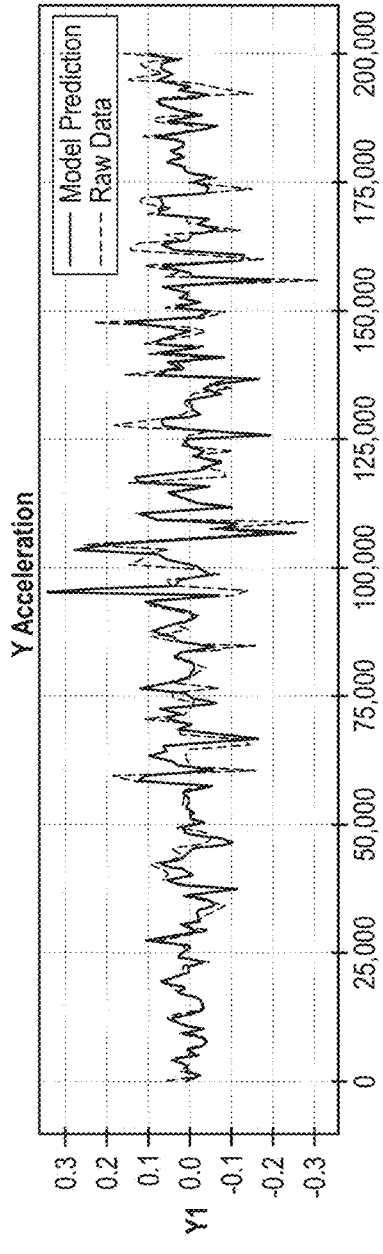
FIG. 16B is a graphical diagram representing exemplary results of neural network autoencoder compression and decompression of y-axis acceleration data according to the example of FIG. 15.
Figure 16C:
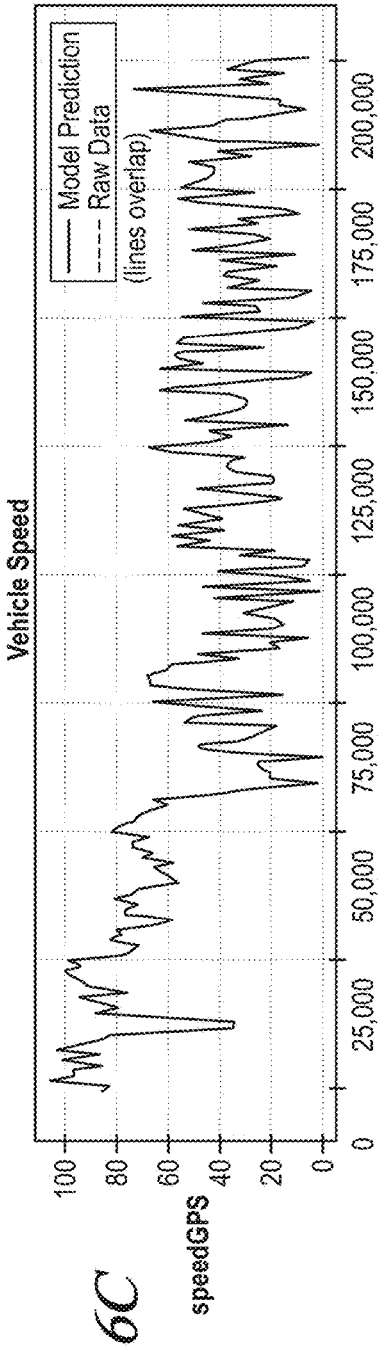
FIG. 16C is a graphical diagram representing exemplary results of neural network autoencoder compression and decompression of vehicle speed data according to the example of FIG. 15.

In another embodiment, with further reference now to FIG. 15, a neural network autoencoder 900 may be implemented to transform and compress the input CAN bus signals 910 in a first (i.e., encoder) layer 920, and after transmittal of the compressed data into the cloud to further reconstruct the data in a second (i.e., decoder) layer 940 for use by tire wear models to predict tire performance. As further illustrated in three graphical diagrams, a first vehicle acceleration data stream (x-axis acceleration as shown in FIG. 16A), a second vehicle acceleration data stream (y-axis acceleration as shown in FIG. 16B) and a vehicle speed data stream (as shown in FIG. 16C) can be compressed and reconstructed to their respective original signals with very high accuracy. In each diagram, the raw data and the reconstructed data are overlaid to highlight this accuracy.

Neural network autoencoders 900 are well known in the art for implementing reductions in data dimensionality, and typically comprise numerous pairs of layers. An input layer 910 has a first size, which is reduced via encoding layer 920 with subsequent layers until a middle layer 930 is reached, after which the layer sizes increase via decoding 940 until an output layer 950 having the first size. An exemplary use of an autoencoder as disclosed herein may vary from the conventional arrangement in that it further includes a specialized third (i.e., wear estimation) layer 960 that is designed and appended to the second layer 950. The specialized third layer 960 is configured to implement wear rate calculations to transform raw CAN bus signals into an instantaneous (actual) wear rate 970. For example, the wear layer may comprise proprietary equations containing specific vehicle and tire information relating to the physical system. Because the original vehicle kinetics data signals can be reconstructed with very high accuracy via the first and second layers of the neural network, the additional third (wear specific) layer can similarly be highly accurate.

This third layer 960 further may enable the first (encoding) layer 920 and second (decoding) layer 940 to be specifically trained over time for estimating wear. During the training process the encoding and decoding layers learn to capture and store the most essential information for wear calculations. For example, an estimated instantaneous wear rate or predicted wear rate can be compared against an actual wear rate to generate a model error value 980. A feedback loop 990 provides the model error values back to the autoencoder for updating of model weights and biases in the first layer 920 and/or second layer 940. The third layer 960 will propagate through weights specific to estimating or predicting tire wear.

Otherwise stated, appending the third layer 960 to the end of a conventional autoencoder (i.e., after the second layer 940) allows the neural network to learn a representation of how to best transform the CAN bus signals to be used for predicting tire wear, whereas a conventional autoencoder would simply learn the best representation for direct regurgitation of the original signals. With an improved encoding layer, as learned over time via for example the aforementioned feedback system, the data is encoded in a manner that enables the decoding layer to produce optimal signals for estimating or predicting tire wear.

This network architecture may enable the network to learn the physically most important signal features and patterns (peaks, valleys, cross-signal relationships, etc.) for wear and efficiently propagate those features through the network.

In another embodiment, the system may be configured to run a Fourier transform on the raw data stream and to extract the most relevant frequencies. These frequencies and accompanying amplitudes may further be used after transmission to the cloud to reconstruct the full raw data state.

Another exemplary embodiment as disclosed herein, further by reference to FIGS. 17-23, relates to the use of Bayesian methods in the characterization and prediction of tire wear. The foundation of this approach is the representation of factors contributing to wear (such as driving style, vehicle alignment settings, routes, road surfaces, environmental conditions, tire manufacturing variability, etc.) as probability distributions. The rationale behind representing these as probability distributions is that the variations observed in each of these factors are not noise, but truly represent the natural variation that is observed with regards to wear. For example, the same tire being used by an aggressive first driver (who accelerates and brakes hard), relative to a second driver who is more careful, would experience very different tire wear life span. An average representation of these two drivers, when used with a conventional prediction model, would produce a prediction that is insufficient when applied for either case individually.

The effect of such a probabilistic representation of the contributing factors is that the predictions made by a wear algorithm will also be probabilistic, i.e., the prediction is also a distribution. There are several benefits for using distributions when reporting the prediction. First, predictions can carry a measure of uncertainty with them i.e. tread wear is 4.1 mm+/−0.05 mm or wear out prediction is 55,000 miles+/−3000 miles (both ranges could correspond to specific confidence levels, such as 95% or 98%). Second, Bayesian inference can be used to update these distributions based on observations. Such observations could for example be on the predicted variables (e.g., measurement of tread depth) or input variables (accelerations characterizing driving style). The value of this inference may be in that the model or an associated system as further described below can continue updating the prediction, as well as the confidence in such predictions, over time with respect to for example a specified distance traveled or a time spent traveling using the associated tire(s).

Figure 17:
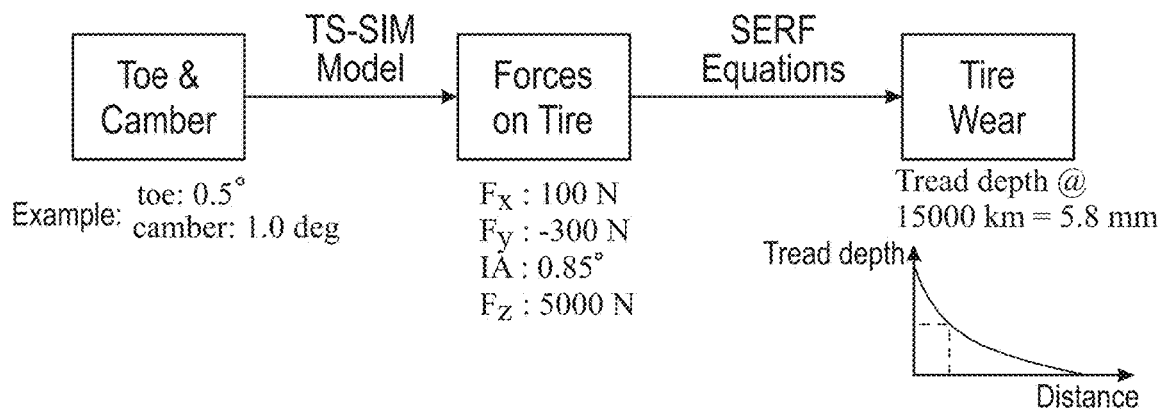
FIG. 17 is a block diagram representing a traditional approach for tire wear analysis, e.g., using vehicle alignment data.
Figure 18:
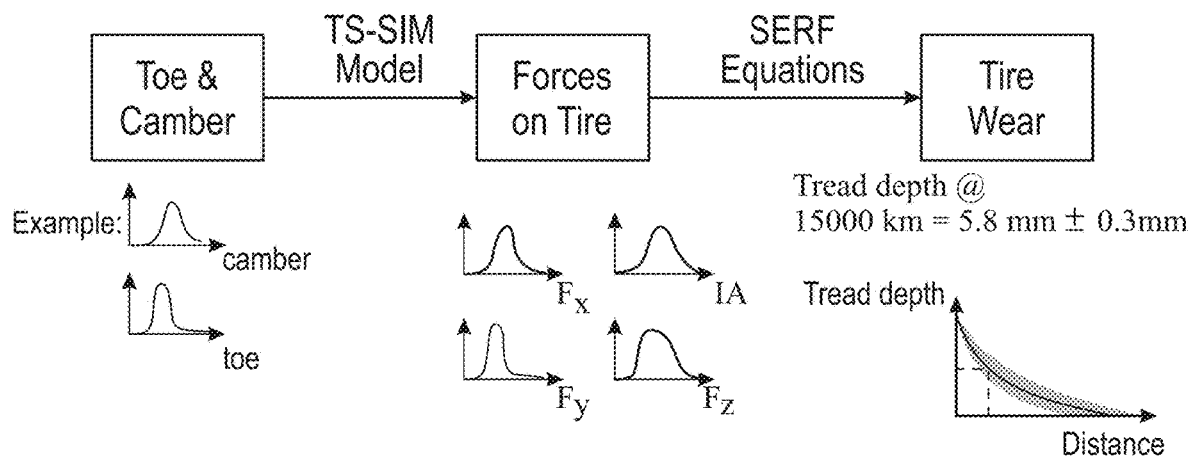
FIG. 18 is a block diagram representing an exemplary Bayesian approach for tire wear estimation.

Referring to the schematic in FIG. 18, an exemplary process flow may be illustrated by way of comparison to a traditional approach as represented in FIG. 17. Probabilistic distributions of factors such as vehicle wheel and suspension settings relating to tire wear can be generated and fed into a vehicle model, as opposed to specific target or measured values for the same factors. One example of such a factor is the camber angle, otherwise known as the angle from the normal of a road surface through the center of a respective wheel (upon which the tire is mounted) to a center line of the wheel. Another example of such a factor is toe angle, otherwise known as the angle of the tire with respect to the longitudinal axis of the respective vehicle.

From these initial ranges, further probabilistic distributions may be generated regarding or otherwise corresponding to each of a plurality of relevant forces (e.g., a tractive or longitudinal force Fx, a lateral force Fy, a vertical or normal force Fz) and/or moments (e.g., overturning torque My, aligning torque Mz) on an associated tire, again as opposed to individual values for the same forces. The force distributions may be fed into a tire wear model wherein tread depth is estimated for a given distance traveled (e.g., 15000 km) according to a baseline value (e.g., 5.8 mm) with a calculated range of uncertainty (e.g., +/−0.3 mm) as opposed to the baseline value alone.

The probability distribution for the tread depth, as shown in the schematic above, can subsequently be updated based on observations. This update may be implemented using a representation of the Bayes theorem which is shown here:

$$\underbrace{P(\text{model} \mid \text{observations})}_{\text{posterior}} \propto \underbrace{P(\text{observations} \mid \text{model})}_{\text{likelihood}} \times \underbrace{P(\text{model})}_{\text{prior}}$$

Bayesian filtering approaches are known in the art to determine the likelihood of a given measurement in view of, e.g., all previous corresponding measurements in a sensor data stream. Here, the term "model" refers to the parameters of the model and the term "observations" denotes the measurements made on any/all variables involved in the model. According to the aforementioned equation, information relating to the tire wear predictions can be updated over time using actual measurements. In other words, using this approach we can "correct" the model prediction with every measurement that is taken of a particular tire element and/or vehicle-tire system. For example, if tread depth measurements are periodically collected and transmitted or otherwise compiled for application according to a system and method as disclosed herein, such measurements can be implemented to reduce the uncertainty and enable better predictions over time.

Figure 19:
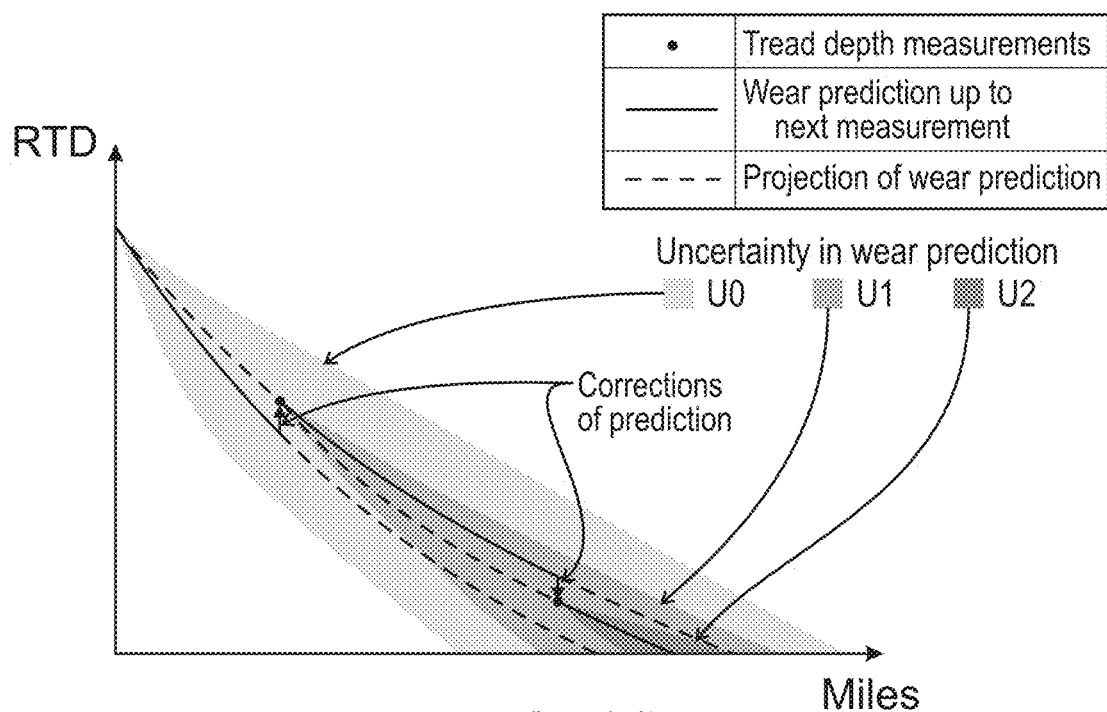
FIG. 19 is a graphical diagram representing an exemplary tire wear model correction.

Referring next to FIG. 19, corrections in tear wear prediction may be provided periodically along with tread depth measurements, wherein an uncertainty in the wear prediction is correspondingly reduced. As measurements of tread depth (or an equivalent tire wear-related factor) are collected over time, potential alternative models or time-series curves may be effectively ruled out or minimized in relevance with respect to a given tire, vehicle-driver-tire system, or the like, and subsequent tire wear estimations may be more accurately provided and with less uncertainty in their respective outcome.

As illustrated, a wear prediction curve proceeds from a first point (along the y-axis) with a surrounding wear prediction uncertainty U0. After a subsequent tread depth measurement, a corrected wear prediction curve is generated along with a reduced level of uncertainty U1 in the wear prediction. In this example, the second envelope of uncertainty U1 falls entirely within the first envelope. After another tread depth measurement, a third and further corrected wear prediction curve is generated, along with a still further reduced level of uncertainty U2 in the wear prediction.

Figure 20:
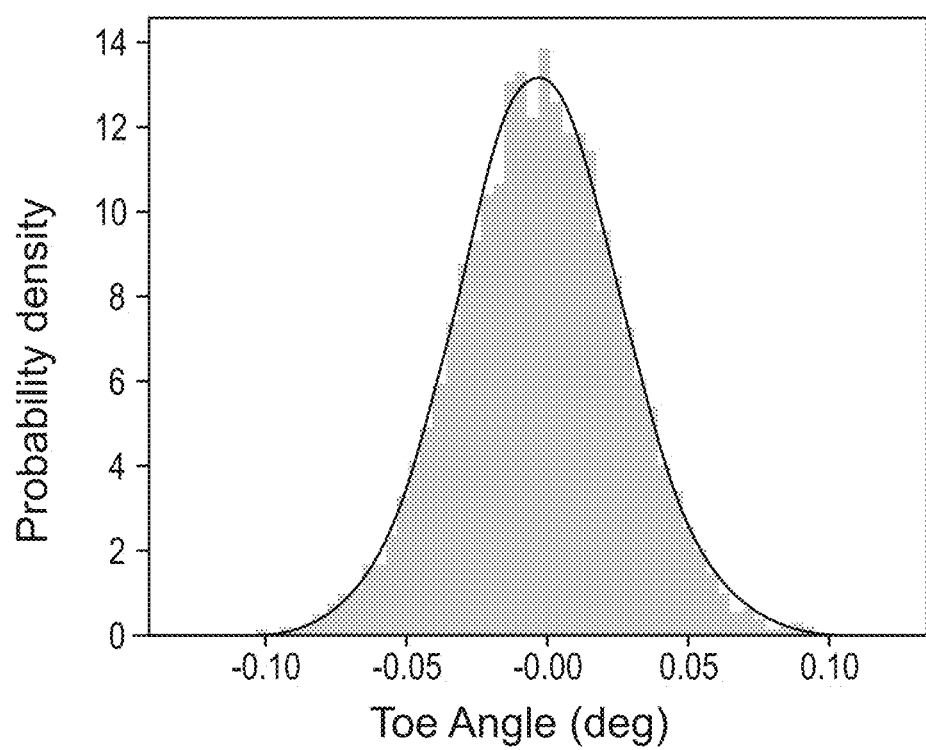
FIG. 20 is a graphical diagram representing an exemplary application of a Monte Carlo simulation to build a set of toe angle distributions.
Figure 21:
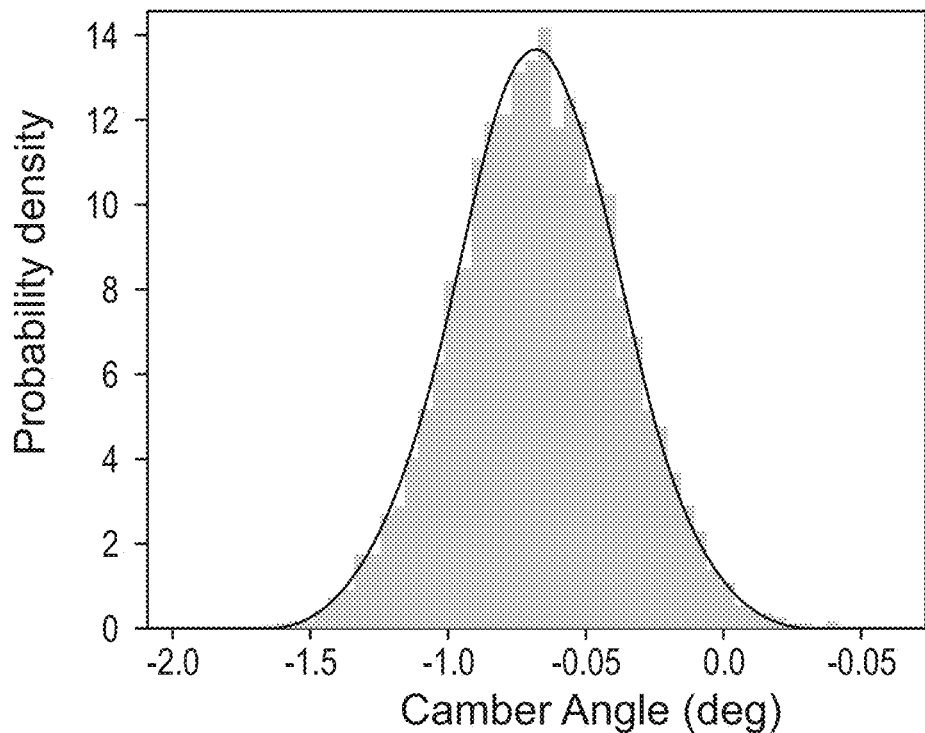
FIG. 21 is a graphical diagram representing an exemplary application of a Monte Carlo simulation to build a set of camber angle distributions.
Figure 22:
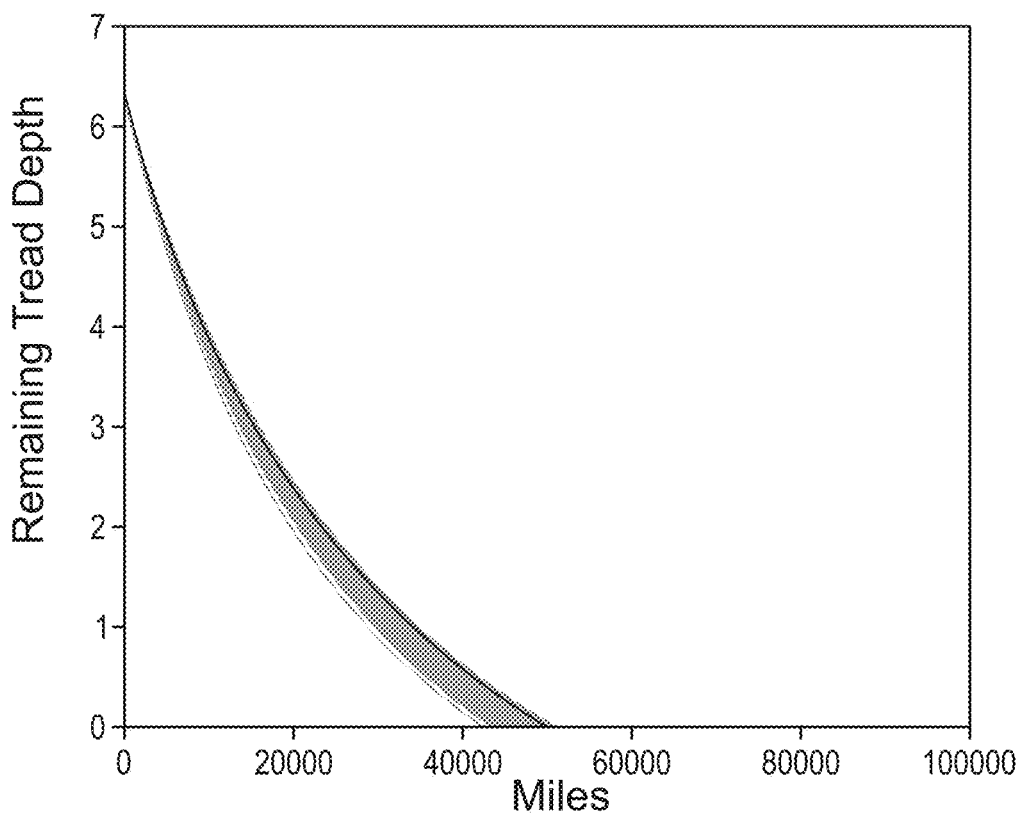
FIG. 22 is a graphical diagram representing an exemplary set of wear progression curves for a front tire.
Figure 23:
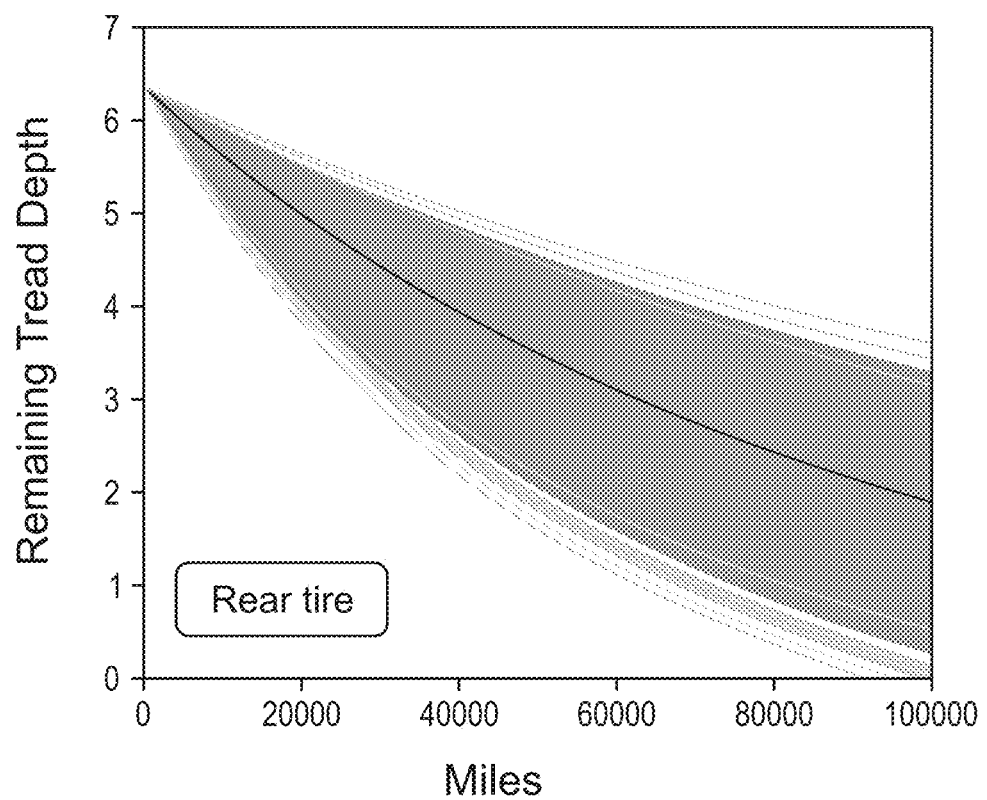
FIG. 23 is a graphical diagram representing an exemplary set of wear progression curves for a rear tire.

Referring next to FIGS. 20 and 21, an exemplary application of a Monte Carlo approach is represented to build probabilistic distributions and use those distributions to generate a distribution of wear progression curves (see, e.g., a wear progression curve for an exemplary front tire as shown in FIG. 22 and a wear progression curve for an exemplary rear tire as shown in FIG. 23). In other words, for a given variation in vehicle alignment settings, the approach seeks to determine a corresponding variation in wear progression. In the particular illustrated case, the inputs were assumed to be independent normal distributions only for the toe angle and the camber angle, wherein everything else is known as single points. Although toe angle and camber angle have been selected for illustration herein, it may be understood that alternative or additional vehicle and/or tire settings may be suitable for the tire wear models and accordingly implemented by the systems and methods as disclosed herein, unless otherwise specifically noted.

Referring in particular to the rear tire progression curves in FIG. 23, a central curve represents a nominal toe angle/camber angle setting, wherein the surrounding region represents ten thousand individual wear progression curves corresponding to respective initial wear rates Ew. As may be observed, with increasing mileage the variation in wear progression also correspondingly increases. By implementing periodic measurements of values for the underlying factors, an appropriate subset of the individual wear progression curves can be identified with increasing certainty over time, wherein the tire wear status can be accurately predicted with only a relatively small number of actual measurements.

Accordingly, even periodic measurements of the tread depth or other relevant factors provide real time feedback to users (e.g., fleet managers, end-users) and enhance the ability to predict the wear life left in the tire and further maximize the remaining value in the tire.

Periodic measurements associated with tire wear (e.g., tire tread depth) for supplementing the probabilistic distributions may be made directly (manually by users and/or via one or more sensors), and/or estimated in accordance with tire wear models and techniques as otherwise described herein.

Figure 24:
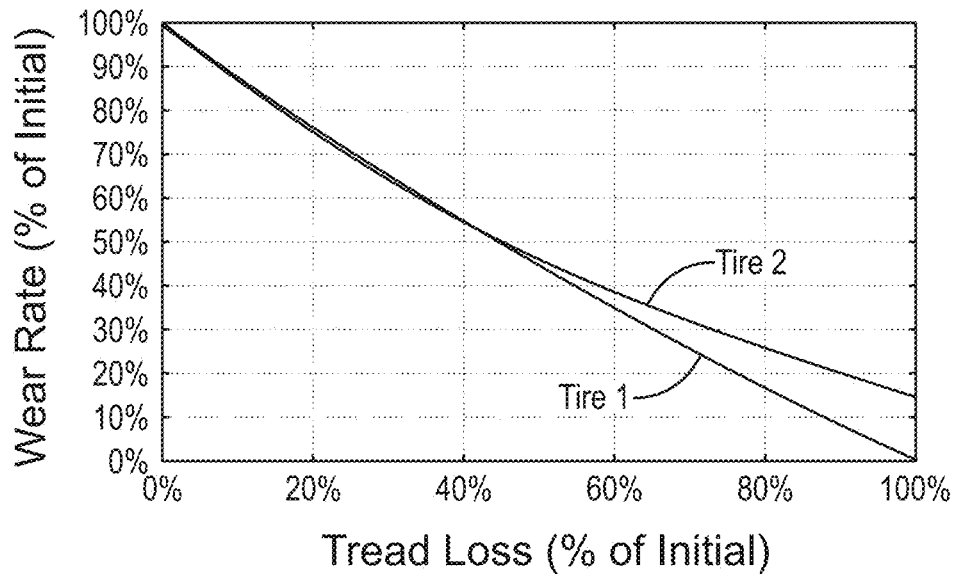
FIG. 24 is a graphical diagram representing an exemplary brush model for wear output.
Figure 25:
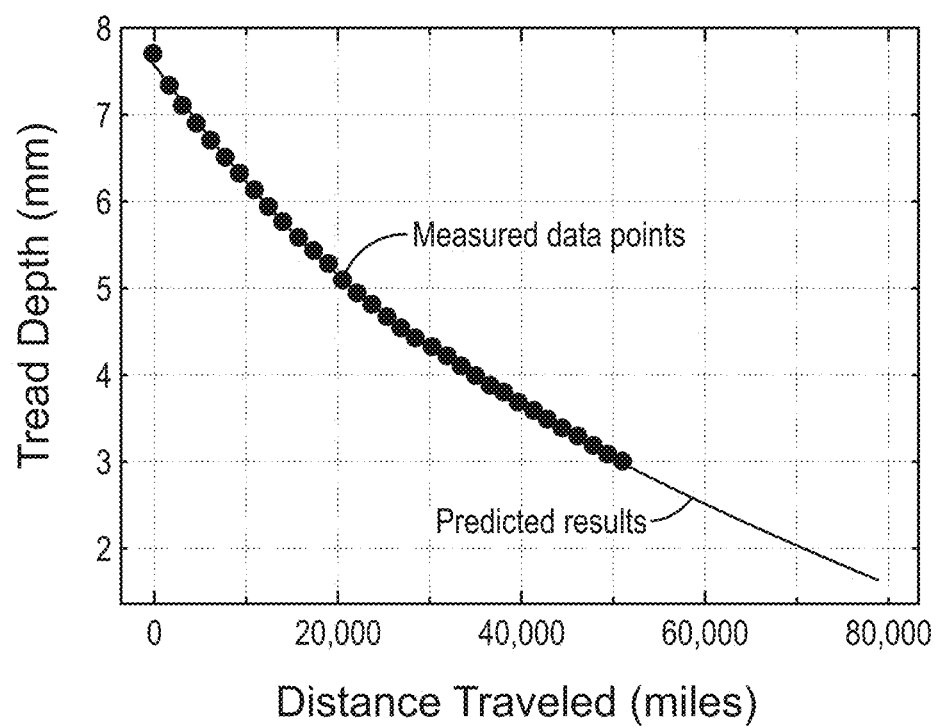
FIG. 25 is a graphical diagram representing an exemplary tire wear model prediction, in contrast to measured data.
Figure 26:
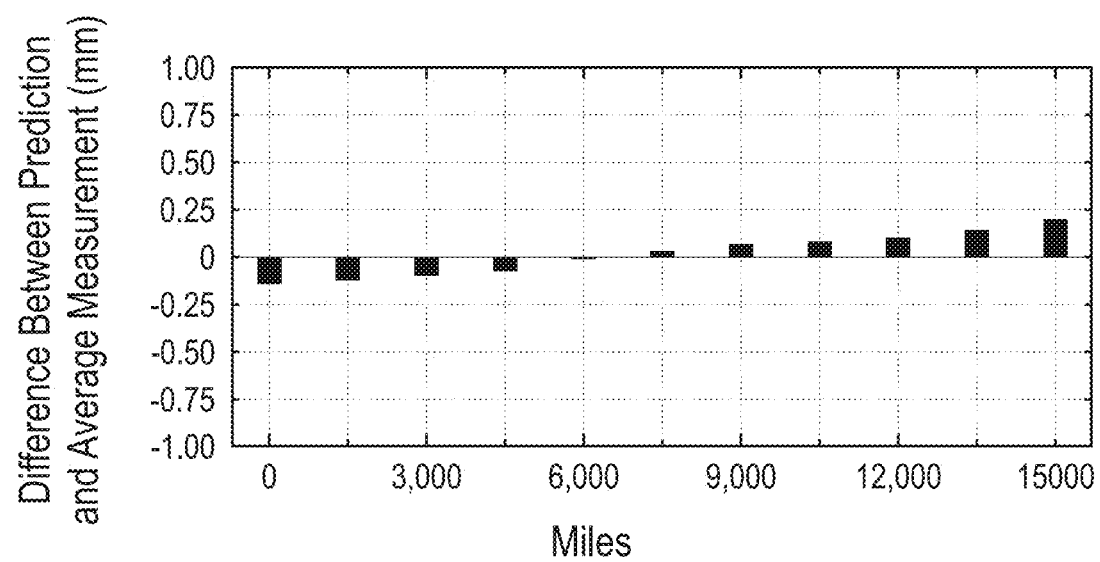
FIG. 26 is a graphical diagram representing the difference between tire wear model predictions as disclosed herein and various indoor wear test results for the same control tire.

Another exemplary embodiment of a method as disclosed herein, further by reference to FIGS. 24-26, relates to the use of brush-type analytics in the characterization and prediction of tire wear. A brush-type model is a simplified tire model with a logical physical background that models the tread elements as independent "brush bristles" extending outward from a base material of the tire (e.g., carcass). The brush-type model greatly reduces the complexity of modeling a contact interface between the road surface and the base material, wherein the modeled tread elements can deform in various measurable directions (e.g., longitudinal, lateral, vertical) and can capture the first order effects (tread block stiffening and contact area increasing) that occur in a real tire as it wears. In alternative embodiments, the characterization and prediction of tire wear can be implemented using other physics based tire wear models, such as for example finite element analysis (FEA).

An embodiment of the method as disclosed herein further advantageously predicts the absolute wear rate of the tire under a given condition, rather than merely predicting how the wear rate changes as tread depth decreases. This is accomplished at least in part by normalizing a current normalizing the modeled wear rate (e.g., based on periodic or otherwise updated measurements) with respect to the wear rate at the original tread depth (i.e., initial wear rate).

Referring for example to the graphical diagram in FIG. 24, an exemplary output of the model is illustrated with the normalized wear rate ratio on the y-axis, and the tread loss on the x-axis for two different tires. An initial wear rate may be provided as an input to the system, for example but without limitation being provided from an FEA stage, a machine learning model, or the like, the tread depth progression for the entire life of a give tire can be predicted.

Referring next to FIG. 25, an exemplary set of results are illustrated when using this predictive method to simulate a wear reference tire compared with measured data of the same tire/vehicle/vehicle-tire system via outdoor wear testing. The circular markers indicate the mean tread depth of the control tire test results at each inspection mileage, whereas the underlying solid line represents the predicted tread depth as normalized with respect to an initial tread depth and further via the brush-type model.

Validation data as further represented in FIG. 26 further indicates an acceptable model fit for an exemplary tire wear model such as a hybrid brush-type model as disclosed herein. In this case, the difference between prediction results and indoor wear test results of a certain control tire was less than 0.25 mm for each mileage for which the tread depth was inspected.

A hybrid brush-type model as disclosed herein is extremely fast and efficient and can be executed substantially in real-time. The test results to date show that the model is accurately predicting wear progression for very different tire designs. Only a relatively small subset of inputs is needed, such as for example the original tread depth and the contact/void area at various tread depths. This information can be taken from, e.g., 3D models of the tread pattern, or from a circumferential tread wear imaging system (CTWIST) measurement of a tire, which is typically provided for every tire tested for indoor or outdoor wear.

In an embodiment, other tire-related threshold events can be predicted and implemented for alerts and/or interventions within the scope of the present disclosure. For example, the system can identify other services that are recommended for a given vehicle based on time-series inputs received and processed as described above, predicted tire wear, and the like. Examples of such services may include without limitation tire rotation, alignment, inflation, and the like. The system may generate the alerts and/or intervention recommendations based on individual thresholds, groups of thresholds, and/or non-threshold algorithmic comparisons with respect to predetermined parameters.

In an embodiment, an optimal type of tire and/or tire parameter can be predicted and implemented for alerts and/or interventions within the scope of the present disclosure. For example, the system can identify vehicle applications (higher instances of city driving, higher instances of highway driving, etc.) and/or driving styles based at least in part on the time-series inputs received and processed as described above, predicted tire wear, and the like. The system may determine that certain tires are more appropriate for a given vehicle based not only on the type of vehicle but also on the identified vehicle applications and/or driving styles, and further generate the alerts and/or intervention recommendations based at least in part thereon.

As previously noted, tire information may be provided from one or more sensors mounted on a given tire or an associated vehicle. The one or more sensors may be accelerometers mounted directly on, e.g., an inner lining of the tire or a vehicle spindle. Output signals from the sensors may be provided to the hosted server, for example without requiring input from the user.

Figure 27:
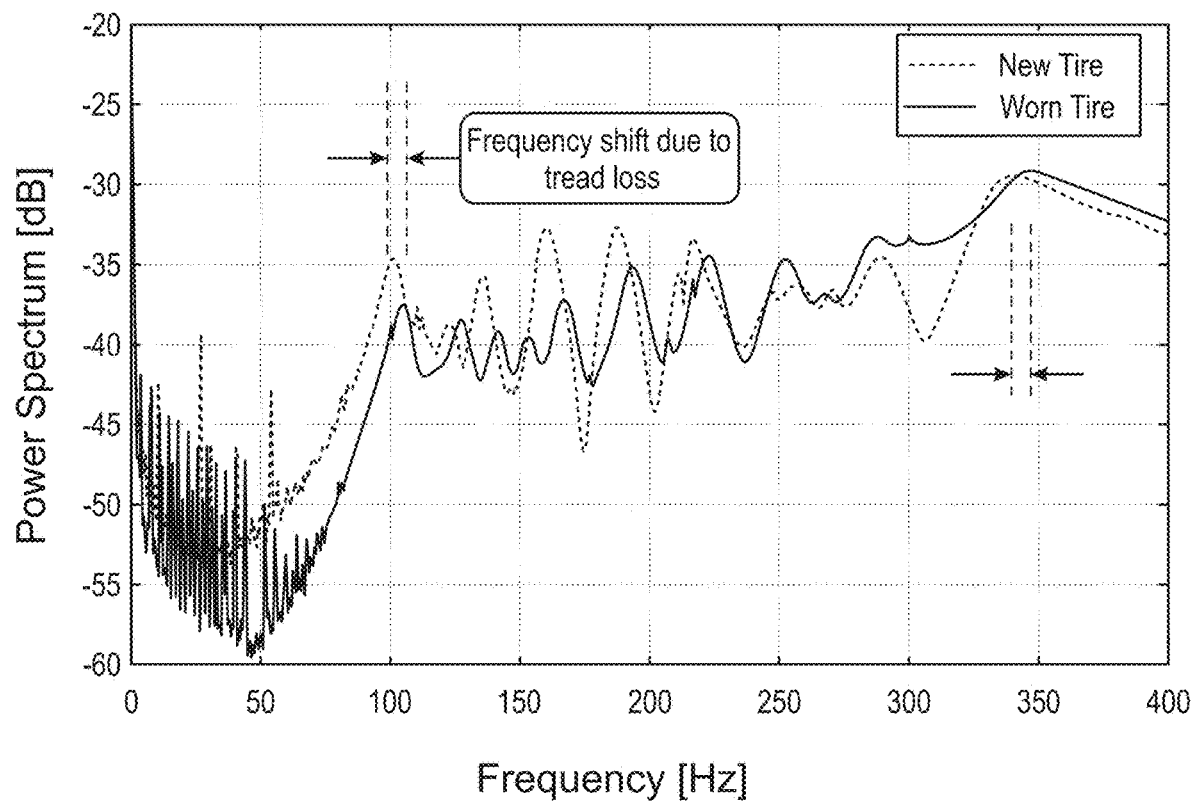
FIG. 27 is a graphical diagram representing exemplary results of static natural frequency tests for a given tire at new and worn states.
Figure 28A:
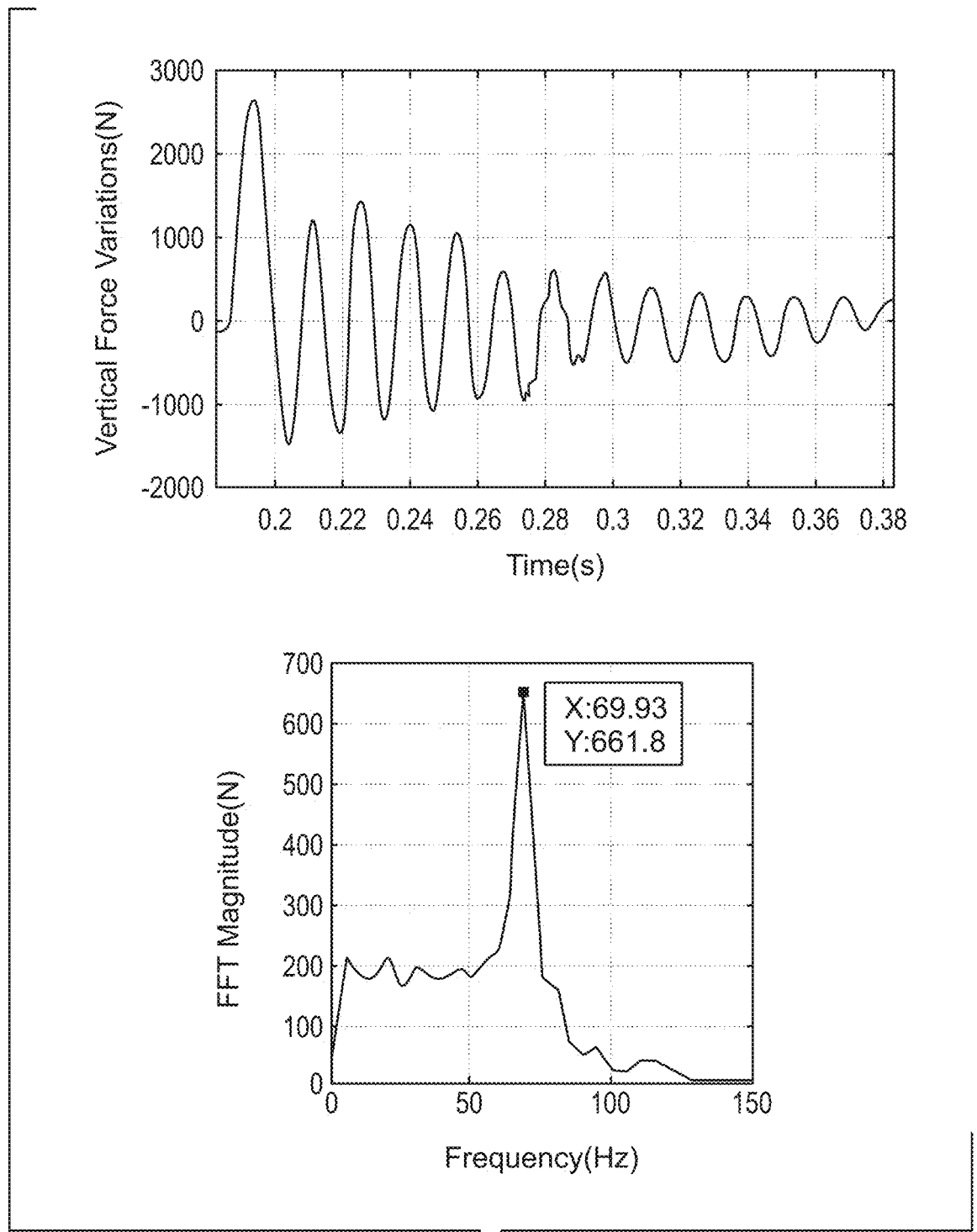
FIG. 28a is a graphical diagram representing exemplary results from a cleat impact simulation for a tire in a new state.
Figure 28B:
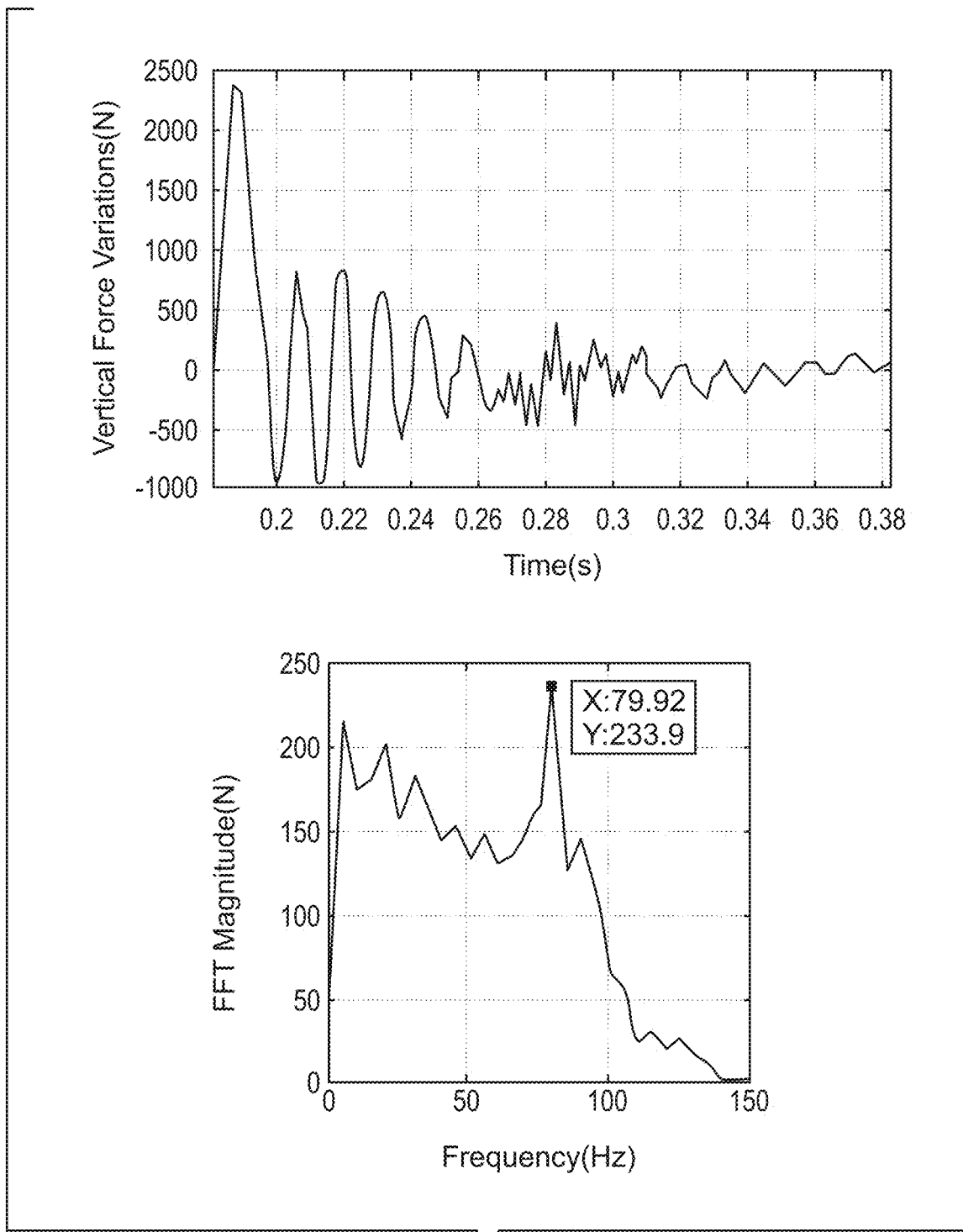
FIG. 28b is a graphical diagram representing exemplary results from a cleat impact simulation for the tire in a worn state.
Figure 29:
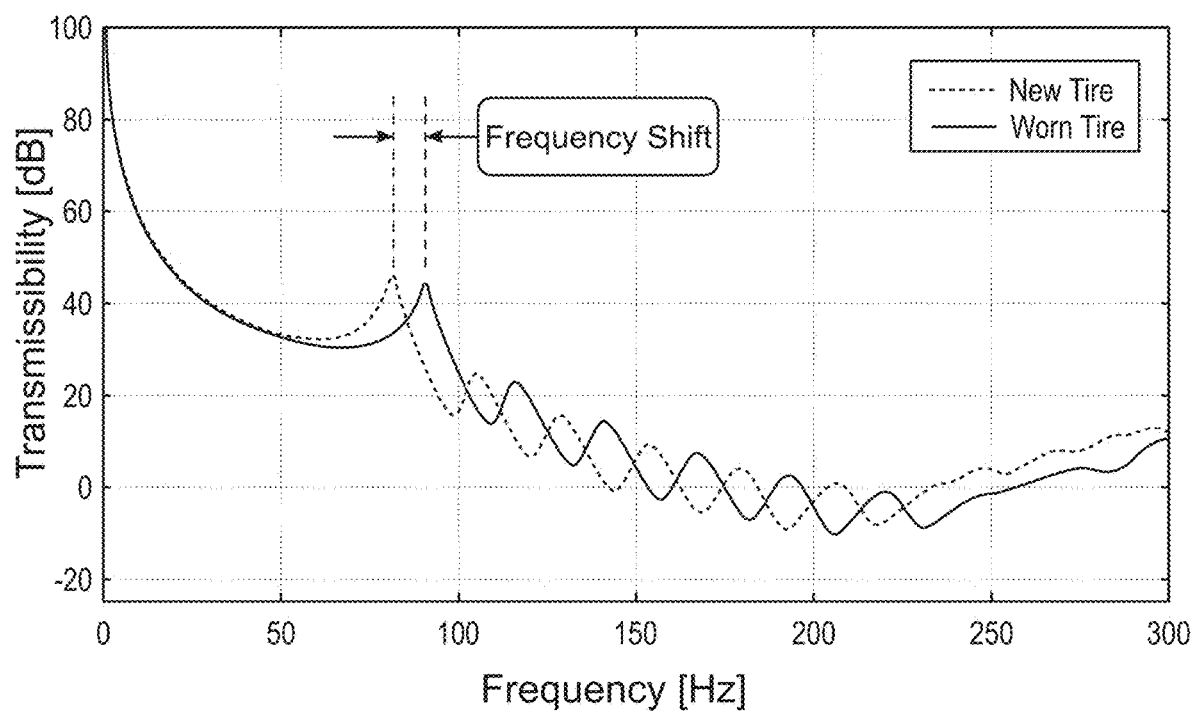
FIG. 29 is a graphical diagram representing exemplary results for a tire in both new and worn states from a transmissibility test.

Referring more particularly now to FIGS. 27-29, another exemplary technique is disclosed herein for estimating the tread depth of a tire. One of skill in the art may appreciate that as the tire wears and loses mass, the modal frequencies change in a manner that either directly relates or can be correlated to the mass loss. This principle is clear when considering a one-degree-of-freedom mass-spring system, where the natural frequency is equal to the square root of the spring stiffness divided by the mass. As the mass decreases, the natural frequency increases. Using this same principle for structural modes of the tire, the mass loss can be determined based on the modal frequency shift by:

$$\Delta m = m\left(1 - \left(\frac{\omega_{n,new}}{\omega_{n,worn}}\right)^2\right)$$

where $\Delta m$ is the mass change, m is the mass when new, and con is the natural frequency.

The modal frequencies can be identified by several methods, including (as previously noted) having an accelerometer attached to the tire, or having an accelerometer attached to the spindle of the vehicle. The tire structural modes may also be excited in various manners, including for example a controlled impacting of the tire with an object (such as a hammer, kicking the tire, etc.), electric excitation, running over an obstacle (such as a cleat or speed bump) and/or running the vehicle-tire combination over a rough surface. In certain embodiments, random excitation events may take place during operation of the vehicle-tire combination, wherein output signals from the sensors may be collected and stored, and/or processed to estimate tire wear.

FIG. 27 illustrates an example from a static natural frequency test where a given tire was impacted by a hammer, and an accelerometer was attached to the inner liner of the tire. The vibrations associated with the impact produce output signals from the accelerometer with Power Spectral Density (PSD) waveforms as shown. The PSD waveform for a given impact represents the frequency distribution for an associated output signal. An accelerometer may be configured to provide an output voltage which may be converted by signal processing circuitry into equivalent acceleration signals. These time domain signals may themselves be further transformed into the frequency domain using, e.g., Fast Fourier Transformation. The frequency response functions in the power spectrum may typically contain magnitude information, represented in decibel (dB) scale.

Corresponding peaks in the frequency spectrum from the respective waveforms for new and worn states of the given tire are highlighted to illustrate the frequency shift due to tread loss there between. In this example, the mass loss calculated from the equation above was 0.474 kilograms (kg), substantially identical to that of an actual measured value of 0.467 kg. In various embodiments, an additional step may be implemented to relate the mass loss to the tread loss, or alternatively it may be more reliable to perform a correlation of modal frequency shift with respect to tread depth for a given tire.

Finite Element Analysis (FEA) simulations have also been performed that show a similar frequency shift from, e.g., both transmissibility tests (where the base is excited by a random input) and cleat impact (where the tire rolls over a cleat).

FIG. 28A represents results from a cleat impact simulation for a new tire, with a first graph illustrating vertical force variations with respect to time and a second graph illustrating Fast Fourier Transform (FFT) magnitude with respect to a range of frequencies (in Hz).

FIG. 28B represents corresponding results from a cleat impact simulation for the same tire in a worn state, wherein a modal frequency shift is readily observable between the new and worn states.

FIG. 29 represents the results from a transmissibility simulation for new and worn states of a given tire, illustrating transmissibility (in dB) with respect to a spectrum of frequencies, again wherein a modal frequency shift is readily observable between the new and worn states, and wherein the frequency shift may be applied to estimate a change in mass and accordingly a change in tire wear/tread depth.

In each of the aforementioned exemplary cases, the illustrated results are for the same tires, wherein the same shift in frequency is observed between worn and new tire models and implemented in the disclosed tire wear model.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of computer-readable medium known in the art. An exemplary computer-readable medium can be coupled to the processor such that the processor can read information from, and write information to, the memory/storage medium. In the alternative, the medium can be integral to the processor. The processor and the medium can reside in an ASIC. The ASIC can reside in a user terminal. In the alternative, the processor and the medium can reside as discrete components in a user terminal.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

Whereas certain preferred embodiments of the present invention may typically be described herein with respect to tire wear and/or tire traction estimation for fleet management systems and more particularly for autonomous vehicle fleets or commercial trucking applications, the invention is in no way expressly limited thereto and the term "vehicle" as used herein unless otherwise stated may refer to an automobile, truck, or any equivalent thereof, whether self-propelled or otherwise, as may include one or more tires and therefore require accurate estimation or prediction of tire wear and/or tire traction and potential disabling, replacement, or intervention in the form of for example direct vehicle control adjustments.

The term "user" as used herein unless otherwise stated may refer to a driver, passenger, mechanic, technician, fleet management personnel, or any other person or entity as may be, e.g., associated with a device having a user interface for providing features and steps as disclosed herein.

The previous detailed description has been provided for the purposes of illustration and description. Thus, although there have been described particular embodiments of a new and useful invention, it is not intended that such references be construed as limitations upon the scope of this invention except as set forth in the following claims.

What is claimed is:

1. A method for estimating vehicle tire wear, the method comprising:
via one or more sensors associated with a vehicle and/or at least one tire of a plurality of tires supporting the vehicle, generating first data corresponding to real-time kinetics of the vehicle and/or the at least one tire;
via a computing system onboard the vehicle, processing the first data to generate second data as a reduced subset of the first data, said second data representative of the first data and comprising any one or more predetermined features extracted therefrom, wherein the second data comprises a plurality of sequential data frames, each data frame comprising a multidimensional histogram of forces associated with the vehicle and/or the at least one tire;

selectively transmitting the second data to a remote computing system via a communications network;

via the remote computing system, processing the second data to estimate a current tire wear characteristic for the at least one tire; and selectively providing real-time feedback based on the estimated current tire wear characteristic the second data is generated via an encoding neural network layer, the third data is generated via a decoding neural network layer, and a wear calculation layer is appended to the output of the decoding neural network layer and configured to transform decoded signals into instantaneous estimated wear values for the at least one tire, a training process for the neural network layers wherein comparing the estimated wear values are compared to actual wear values for the at least one tire to generate an error value, and providing the error value as feedback to the neural network layers.

2. The method of claim 1, further comprising selecting a subset of the data frames between at least first and second events, and summarizing the data frames over a particular time or a particular distance.

3. The method of claim 1, wherein the step of processing the second data to estimate the wear characteristic for the at least one tire comprises, via the remote computing system, processing the second data to generate third data corresponding to the first data, and further processing the third data to estimate the wear characteristic for the at least one tire.

4. The method of claim 1, wherein the extracted features of the second data comprise wear performance characteristics representative of vehicle driving behavior.

5. The method of claim 1, wherein processing the first data comprises a Fourier transform on the first data and generating the second data comprising extracted relevant frequencies and associated amplitudes.

6. The method of claim 1, wherein the second data comprises aggregated data corresponding to an amount of time spent by the vehicle in each of one or more representative driving conditions.

7. The method of claim 1, wherein the selective transmittal of second data is event-based.

8. The method of claim 1, wherein the selective transmittal of second data is time-based.

9. The method of claim 2, wherein the summarizing of the data frames is performed via local processing at the computing system onboard the vehicle prior to transmittal of the summarized data frames to the remote computing system.

10. The method of claim 2, wherein the subset of the data frames are transmitted to the remote computing system and the summarizing of the data frames is performed via the remote computing system.

11. The method of claim 2, further comprising correcting for missing data in a summarized data frame by scaling the summarized data frame by an expected number of data frames with respect to an actual collected number of data frames.

12. The method of claim 3, wherein:
the second data is generated via an encoding neural network layer,
the third data is generated via a decoding neural network layer, and
a wear calculation layer is appended to the output of the decoding neural network layer and configured to transform decoded signals into instantaneous estimated wear values for the at least one tire.

13. The method of claim 12, further comprising a training process for the neural network layers wherein estimated wear values are compared to actual wear values for the at least one tire to generate an error value, and providing the error value as feedback to the neural network layers.

14. A method for estimating vehicle tire wear, the method comprising:

via one or more sensors associated with a vehicle and/or at least one tire of a plurality of tires supporting the vehicle, generating first data corresponding to real-time kinetics of the vehicle and/or the at least one tire;

via a computing system onboard the vehicle, processing the first data to generate second data as a reduced subset of the first data, said second data comprising one or more predetermined features extracted therefrom;

via a global positioning system (GPS) transceiver, generating GPS data corresponding to vehicle positions;

selectively transmitting the second data and the GPS data to a remote computing system via a communications network;

via the remote computing system, processing the second data and the GPS data further in view of a vehicle model and one or more vehicle route characteristics to generate third data corresponding to the first data, and further processing the third data to estimate a current tire wear characteristic for the at least one tire; and selectively providing real-time feedback based on the estimated current tire wear characteristic the second data is generated via an encoding neural network layer, the third data is generated via a decoding neural network layer, and a wear calculation layer is appended to the output of the decoding neural network layer and configured to transform decoded signals into instantaneous estimated wear values for the at least one tire, a training process for the neural network layers wherein comparing the estimated wear values are compared to actual wear values for the at least one tire to generate an error value, and providing the error value as feedback to the neural network layers.

15. The method of claim 14, wherein the second data further comprises a plurality of sequential data frames, each data frame comprising a multidimensional histogram of forces associated with the vehicle and/or the at least one tire, and wherein the remote computing system reconstructs a vehicle route from the collected vehicle position data and provides vehicle route feedback into the respective multidimensional histograms.

16. A method for estimating vehicle tire wear, the method comprising:

via one or more sensors associated with a vehicle and/or at least one tire of a plurality of tires supporting the vehicle, generating first data corresponding to real-time kinetics of the vehicle and/or the at least one tire;

processing the first data, via a computing system onboard the vehicle, to generate second data as a reduced subset of the first data, said second data representative of the first data and comprising any one or more predetermined features extracted therefrom, wherein the second data (930) is generated via an encoding neural network layer;

selectively transmitting the second data to a remote computing system via a communications network; and via the remote computing system, processing the second data to generate third data corresponding to the first data via a decoding neural network layer, processing the third data to estimate a wear characteristic for the at least one tire, and generating a notification associated with the estimated wear characteristic to a computing device associated with a vehicle user the second data is generated via an encoding neural network layer, the third data is generated via a decoding neural network layer, and a wear calculation layer is appended to the output of the decoding neural network layer and configured to transform decoded signals into instantaneous estimated wear values for the at least one tire, a training process for the neural network layers wherein comparing the estimated wear values are compared to actual wear values for the at least one tire to generate an error value, and providing the error value as feedback to the neural network layers.

17. The method of claim 16, wherein:

a wear calculation layer is appended to the output of the decoding neural network layer and configured to transform decoded signals into instantaneous estimated wear values for the at least one tire.

18. The method of claim 17, further comprising a training process for the neural network layers wherein estimated wear values are compared to actual wear values for the at least one tire to generate an error value, and providing the error value as feedback to the neural network layers.

* * * * *